(12) United States Patent
Yamamoto et al.

(10) Patent No.: US 7,956,454 B2
(45) Date of Patent: *Jun. 7, 2011

(54) WIRING BOARD AND CERAMIC CHIP TO BE EMBEDDED

(75) Inventors: Hiroshi Yamamoto, Konan (JP); Toshitake Seki, Komaki (JP); Shinji Yuri, Kasugai (JP); Masaki Muramatsu, Komaki (JP); Motohiko Sato, Konan (JP); Akifumi Tosa, Komaki (JP)

(73) Assignee: NGK Spark Plug Co., Ltd., Nagoya, Aichi (JP)

( * ) Notice: Subject to any disclaimer, the term of this patent is extended or adjusted under 35 U.S.C. 154(b) by 64 days.

This patent is subject to a terminal disclaimer.

(21) Appl. No.: 12/475,648

(22) Filed: Jun. 1, 2009

(65) Prior Publication Data

US 2009/0255719 A1  Oct. 15, 2009

Related U.S. Application Data

(63) Continuation of application No. 11/508,968, filed on Aug. 24, 2006, now Pat. No. 7,557,440.

(30) Foreign Application Priority Data

Sep. 1, 2005 (JP) ................................. 2005-254031
Jun. 9, 2006 (JP) ................................. 2006-161700

(51) Int. Cl.
 *H01L 23/053* (2006.01)

(52) U.S. Cl. ................................. 257/700; 257/E23.001

(58) Field of Classification Search .................. 257/678, 257/734, 758, 759, 779, 700, E23.001
See application file for complete search history.

(56) References Cited

U.S. PATENT DOCUMENTS 6,370,010 B1  4/2002  Kuroda et al.
6,979,890 B2 * 12/2005  Kambe et al. ................. 257/678

FOREIGN PATENT DOCUMENTS

| JP | 2000-261124 | 9/2000 |
|---|---|---|
| JP | 2001-118746 A | 4/2001 |
| JP | 2004-172412 | 6/2004 |
| JP | 2005-039217 | 2/2005 |
| JP | 2005-039243 | 2/2005 |

OTHER PUBLICATIONS

Japan Patent Office, Office Action, mailed Dec. 8, 2009, in the corresponding Japan Patent Application No. 2006-161700.

* cited by examiner

*Primary Examiner* — N Drew Richards
*Assistant Examiner* — Hoa B Trinh
(74) *Attorney, Agent, or Firm* — Stites & Harbison PLLC; Jeffrey A. Haeberlin

(57) ABSTRACT

A wiring board includes a substrate core and a ceramic chip to be embedded therein. The substrate core has a housing opening portion opening at a core main surface. The ceramic chip is accommodated in the housing opening portion so that the core main surface and a chip first main surface face the same way. The ceramic chip includes a plurality of second terminal electrodes comprised of a metallized layer and formed on the chip second main surface so as to protrude therefrom. A projecting portion, disposed on the second main surface side so as to surround a plurality of the second terminal electrodes, is formed on the chip second main surface so as to protrude therefrom.

17 Claims, 13 Drawing Sheets

WIRING BOARD AND CERAMIC CHIP TO BE EMBEDDED

CROSS-REFERENCE TO RELATED APPLICATIONS

This application is a continuation of prior application Ser. No. 11/508,968, filed Aug. 24, 2006 now U.S. Pat. No. 7,557,440, which claims priority to Japanese patent Application No. 2005-254031, filed Sep. 1, 2005 and Japanese patent Application No. 2006-161700, filed Jun. 9, 2006, the entire disclosures of which are hereby incorporated by reference.

FIELD OF THE INVENTION

This invention relates to a wiring board having a structure wherein a ceramic chip to be embedded is accommodated in a housing opening portion of a substrate core, and a built-up layer is further laminated and formed on the surface of the ceramic chip, and to a ceramic chip to be so embedded.

BACKGROUND OF THE INVENTION

In recent years, semiconductor integrated circuit elements (IC chips) used for a CPU in computers or the like operate at higher speeds with high level functional features, than previously. Along with this advance, the number of terminals has increased and the terminal interval has tended to be smaller or more narrow. Generally speaking, in such constructions, terminals in large numbers are densely formed on the bottom surface of the IC chip in an array, and a terminal block so formed is connected to a further terminal block at the motherboard side by a conventional "flip chip" connection. However, because there is a large difference in pitch between the terminal block at the IC chip side and the terminal block at the motherboard side, it is difficult to directly connect the IC chip to the motherboard. Therefore, the connection method generally employed is one wherein the IC chip is first mounted on a wiring board adapted for mounting the IC chip, and then the wiring board is mounted on the motherboard. An example of such wiring boards for mounting the IC chip includes a wiring board wherein a ceramic chip is embedded in a core substrate comprised of a polymer material so as to form a core portion, and a built-up layer is formed on both top and rear surfaces of the core portion, respectively. See, for example, Japanese Patent Application Laid-Open (kokai) No. 2005-39217 and Japanese Patent Application Laid-Open (kokai) No. 2005-39243.

A manufacturing method for the above-described conventional wiring board for mounting an IC chip will now be discussed with reference to FIGS. 18 and 19. As shown in FIG. 18, a substrate core 211 is first prepared. Substrate core 211 is comprised of a polymer material and includes a housing opening portion 214, i.e., an opening that serves as a housing, which opens at both a core top surface 212 and a core rear surface 213. Further, a ceramic chip 221 to be embedded in core 211 is prepared. Chip 221 includes a plurality of terminal electrodes 224 formed on a top surface 222 and a rear surface 223, respectively, of chip 221 so as to protrude therefrom. Next, a taping step, wherein an adhesive tape 231 is adhered to the side facing the core rear surface 213, is performed so that the opening at the side of the core rear surface 213 of the housing opening portion 214 may be sealed in advance. Then, an accommodation step for accommodating the ceramic chip 221 in the housing opening portion 214 is performed so as to temporarily fix the rear surface 223 of the ceramic chip 221 to an adhesive face 232 of the adhesive tape 231. Subsequently, a filler 241 is disposed in the gap between the inner surface of the housing opening portion 214 and the side face 225 of the ceramic chip 221, and is cured in a fixing step to thereby fix the ceramic chip 221 in the substrate core 211. After this step, a built-up layer is formed on the top and rear surfaces of the core portion, which is comprised of the substrate core 211 and the ceramic chip 221, by alternately forming (i) a plurality of interlayer insulating layers principally comprised of polymer material and (ii) a plurality of conductor layers. This completes the wiring board for mounting the IC chip.

A disadvantage of the method of FIGS. 18 and 19 is that when the above-mentioned gap is filled with filler 241, the ceramic chip 221 is likely to float from, i.e., be vertically spaced from, the adhesive face 232 of the adhesive tape 231 by the height of the terminal electrodes 224. As a result, the filler 241 may overflow onto a chip rear surface 223 of the ceramic chip 221 (as shown in FIG. 19). In particular, when the terminal electrodes 224 are not disposed in an outer circumferential portion of the ceramic chip 221, the thickness of the outer circumferential portion is thinner than that of a portion at which the terminal electrode 224 is disposed, so that an overflow of the filler 241 is likely to occur. As a result, the terminal electrodes 224 on the rear surface 223 of the ceramic chip will be covered with the filler 241, thereby causing failure of the electrical connection to a built-up layer provided at the rear surface of the above-mentioned core portion. Moreover, even when an electrical connection with the built-up layer is made, the connection may not be reliable.

SUMMARY OF THE INVENTION

According to one aspect thereof, the present invention is concerned with addressing the above-described problems, and, in this regard, an object of the invention is to provide a wiring board offering a secure and reliable electrical connection between the built-up layer and the ceramic chip to be embedded. Another object of the present invention is to provide a suitable ceramic chip to be embedded for use in a wiring board.

In accordance with one embodiment of the invention, the above-mentioned problems are solved through the provision of a wiring board, comprising: a substrate core having a core main surface, a core rear surface and a housing opening portion which opens, at least, at said core main surface; a ceramic chip including a ceramic sintered body having a chip first main surface and a chip second main surface, an inner conductor located inside of said ceramic sintered body, a plurality of first terminal electrodes comprised of a metallized layer, electrically connected to said inner conductor formed on said chip first main surface so as to protrude therefrom, and a plurality of second terminal electrodes comprised of a metallized layer, electrically connected to said inner conductor, formed on said chip second main surface so as to protrude therefrom, wherein the ceramic chip is accommodated in said housing opening portion in the state where said core main surface and said chip first main surface face in the same direction; a filler disposed in a gap between an inner surface of said housing opening portion and the side face of said ceramic chip so as to fix said ceramic chip in place; and a built-up layer comprising at least one interlayer insulating layer and at least one conductor layer are alternately laminated on said core main surface and said chip first main surface, wherein a projecting or convex portion, disposed on a second main surface side surrounding the plurality of second terminal electrodes, is formed on said chip second main surface so as to protrude therefrom.

Therefore, according to the wiring board of this embodiment, because the projecting or convex portion at the second main surface side which surrounds a plurality of second terminal electrodes is formed on the chip second main surface, overflow of the filler onto the chip second main surface is prevented by the projecting or convex portion at the second main surface side when the gap between the inner surface of the housing opening portion and the side face of the ceramic chip is filled by the filler. Thus, the second terminal electrode is prevented from being covered with the filler, thereby ensuring a good electrical connection between the ceramic chip to be embedded and the built-up layer or the like.

According to a further embodiment of the invention, there is provided a wiring board comprising: a substrate core having a core main surface, a core rear surface and a housing opening portion which opens at both said core main surface and said core rear surface; a ceramic chip including a ceramic sintered body having a chip first main surface and a chip second main surface, an inner conductor located inside of said ceramic sintered body, a plurality of first terminal electrodes, electrically connected to said inner conductor, formed on said chip first main surface so as to protrude therefrom, and a plurality of second terminal electrodes, electrically connected to said inner conductor, formed on said chip second main surface so as to protrude therefrom, the ceramic chip being accommodated in said housing opening portion such that said core main surface and said chip first main surface face in a common direction and said core rear surface and said chip second main surface face in a common direction; a filler filled in a gap between an inner surface of said housing opening portion and a side face of said ceramic chip so as to fix said ceramic chip in place; a first built-up layer comprising at least one interlayer insulating layer and at least one conductor layer alternately laminated on both said core main surface and said chip first main surface;

a second built-up layer comprising at least one interlayer insulating layer and at least one conductor layer alternately laminated on both said core rear surface and said chip second main surface; and a projecting or concave portion, disposed on a second main surface side of the chip so as to surround said plural second terminal electrodes, formed on said chip second main surface so as to protrude therefrom.

Therefore, according to this particular embodiment, because the projecting portion at the second main surface side which surrounds a plurality of second terminal electrodes is formed on the chip second main surface, an overflow of the filler onto the chip second main surface is prevented by the projecting portion at the second main surface side when the gap between the inner surface of the housing opening portion and the side face of the ceramic chip is filled by the filler. Thus, the second terminal electrode is prevented from being covered with the filler, thereby ensuring a good electrical connection between the ceramic chip and the second built-up layer or the like. In addition, a plurality of first terminal electrodes and a plurality of second terminal electrodes may be comprised of, for example, a metallized layer.

The substrate core of the above-mentioned wiring board is a part of the core portion in the wiring board, and is of a plate-like form or shape including the core main surface and the core rear surface disposed in opposed relation to the core main surface. The substrate core includes one or more housing opening portion(s) for accommodating the ceramic chip to be embedded. The housing opening portion may be a "non-through-hole" which only opens at the core main surface, or may be a through-hole which opens at both the core main surface and the core rear surface. In addition, the ceramic chip to be embedded may be completely embedded in the housing opening portion, or may be accommodated therein so that a part of the ceramic chip protrudes therefrom.

Although the material used in forming the substrate core is not limited to the following, a preferred substrate core is comprised principally of a polymer material. Examples of polymer materials that may be used in forming the substrate core include EP resin (epoxy resin), PI resin (polyimide resin), BT resin (bismaleimide triazine resin), PPE resin (polyphenylene ether resin), and the like. Further, a composite material made of these resins and organic fibers, such as glass fiber (glass woven fabric and non-woven glass fabric) and polyamide fiber.

Preferably, the ceramic chip to be embedded in the above-mentioned wiring board comprises a plate-like ceramic sintered body including a chip first main surface and a chip second main surface located opposed to the chip first main surface. The ceramic chip is accommodated in the housing opening portion so that the core main surface and the chip first main surface face in the same direction. Further, the ceramic chip is fixed by, for example, filler comprised of a polymer material. Preferably, a sintered body of a high temperature-firing ceramic, such as alumina, alumimium nitride, boron nitride, silicon carbide and silicon nitride, is employed as the ceramic sintered body of the chip. Also, a sintered body of a low temperature-firing ceramic, such as a glass-ceramic formed in such a manner that an inorganic ceramic filler, such as alumina, is added to a borosilicic acid system glass or lead borosilicate system glass is preferably employed. In the latter case, it is also preferable to employ a sintered body of a dielectric ceramic, such as barium titanate, lead titanate and strontium titanate, according to the application. When a sintered body of a dielectric ceramic is employed, the corresponding ceramic capacitor will be expected to have a large electrostatic capacitance.

The aforementioned inner conductor is formed inside of the ceramic sintered body. The material used in forming such an inner conductor is not limited to the following materials, however, a metal which can be sintered simultaneously with ceramics, for example, nickel, molybdenum, tungsten, titanium or the like, is suitable. In addition, when the sintered body of a low temperature-firing ceramic is adopted, copper, silver or the like can be employed as a material for the inner conductor. The inner conductor may be a via conductor, extending in the thickness direction of the ceramic sintered body or an inner layer conductor layer extending in a planar direction relative to the ceramic sintered body, i.e., orthogonally to the thickness direction.

A plurality of first terminal electrodes electrically connected to the inner conductor are formed on the chip first main surface of the ceramic sintered body so as to protrude therefrom. Similarly, a plurality of second terminal electrodes electrically connected to the inner conductor are formed on the chip second main surface of the ceramic sintered body so as to protrude therefrom. A plurality of first terminal electrodes and a plurality of second terminal electrodes may be comprised of, for example, the metallized layers. Preferably, in order to simultaneously provide sintering with the ceramics, the first terminal electrodes and the second terminal electrode are formed by a metal material suitable for metallizing, such as nickel, molybdenum, tungsten, titanium. It is noted that the metallized layer may be electrically connected to a power supply layer and/or a ground layer.

In on preferred implementation, the ceramic chip to be embedded comprises a ceramic capacitor having an alternating laminated structure wherein a first internal electrode layer and a second internal electrode layer sandwich a ceramic dielectric layer therebetween. Thus, when a ceramic chip that functions as a capacitor is employed, the ceramic chip is located, for example, near a semiconductor integrated circuit element to thereby significantly reduce the floating inductance. As a result, the operating stability of the semiconductor integrated circuit element is improved. It is noted that the term "ceramic capacitor" as used herein includes a capacitor formed such that a thin film comprised of a ceramic material is layered on a non-ceramic substrate (a substrate not limited to ceramics).

The built-up layer constituting the above-mentioned wiring board preferably has a laminated structure wherein an interlayer insulating layer, which is comprised principally of a polymer material, and a conductor layer are alternately laminated. The built-up layer may be formed only at one side of the core portion (i.e., only on the core main surface and the chip first main surface), or may be formed at both sides of the core portion (i.e., on the core main surface and the chip first main surface and on the core rear surface and the chip second main surface). It is noted that an area corresponding to a ceramic chip is established as a semiconductor element mounting portion on the surface of the built-up layer formed on the core main surface and the chip first main surface. Because such semiconductor element mounting portion can mount a semiconductor element, the difference in the thermal expansion coefficient with respect to the semiconductor element can be reduced, as compared with the case wherein the semiconductor element mounting portion is formed on the substrate core. Thus, this structure reduces the influence of thermal stress acting on the semiconductor element.

The projecting or convex portion at second main surface side, which constitutes part of the above-mentioned wiring board, is formed on the chip second main surface so as to protrude therefrom and surround a plurality of second terminal electrodes. In addition, a similar projecting or convex portion (also referred to as a convex portion at first main surface side) may be formed on the chip first main surface so as to protrude therefrom and surround a plurality of first terminal electrodes. With this construction, overflow of the filler onto the chip first main surface is prevented by the convex portion at first main surface side when the gap between the inner surface of the housing opening portion and the side face of the ceramic chip is filled by the filler material. Thus, the first terminal electrode can be prevented from being covered with the filler material.

Preferred materials for forming the convex portion at first main surface side and the convex portion at second main surface side include a polymeric material, a metal material, a ceramic material and the like. As examples of a metal forming the convex portion at first main surface side and the convex portion at second main surface side, nickel, molybdenum, tungsten, titanium, copper, silver or the-like may be employed. Specifically, it is suitable to use the same kind of metal as the first terminal electrode and the second terminal electrode comprised of the metallized layer. In other words, the convex portion at first main surface side and the convex portion at second main surface side are preferably the metallized layers disposed in the outer circumference edge portion of the chip first main surface and the chip second main surface, respectively. With this construction, because the first terminal electrode, the second terminal electrode, the convex portion at first main surface side and the convex portion at second main surface side are all formed simultaneously in the same step, a significant reduction in number of man-hours and costs can be attained. In addition, considering the adhesion provided with the ceramic sintered body, the same composite ceramic material as the ceramic sintered body is preferably employed as the material for forming the convex portion at first main surface side and the convex portion at second main surface side.

Although the thickness of the first terminal electrode and the second terminal electrode is not particularly limited to the following, a thickness of between about 10 µm and 100 µm is preferable. In this regard, when the thickness of the first terminal electrode and the second terminal electrode is less than about 10 µm, the adhesion between the interlayer insulating layer and the ceramic chip to be embedded may not be sufficient. Further, when the thickness of the first terminal electrode and the second terminal electrode exceed about 100 µm, the flatness of the surface of the built-up layer may deteriorate.

In addition, the convex portion at first main surface side preferably has the same height as that of plural first terminal electrodes, or has a height greater than that of the first terminal electrodes. Similarly, the convex portion at second main surface side preferably has the same height as that of plural second terminal electrodes, or has a height greater than that of the second terminal electrodes. With this construction, overflow of filler onto the chip first main surface and the chip second main surface can be prevented. When the convex portion at first main surface side and the convex portion at second main surface side are comprised of the same kind of metal material as that of the first terminal electrode and the second terminal electrode, the first terminal electrode and the convex portion at first main surface side, and the second terminal electrode and the convex portion at second main surface side may be respectively connected to each other.

Further, in the case where a stepped portion is formed on the chip first main surface and the chip second main surface, it is preferable that the convex portions both at first main surface side and at the convex portion at second main surface side are provided in an area including the stepped portion. When the stepped portion is formed on the chip first main surface and the chip second main surface, the above-described problem of overflow of filler onto the chip first main surface and the chip second main surface, which is one of the problems solved by the present invention, is more likely to occur.

The surfaces of plural second terminal electrodes and the convex portion at second main surface side are preferably rougher than that of the chip second main surface of the ceramic sintered body. Further, the surfaces of plural first terminal electrodes and the convex portion at first main surface side are preferably rougher than that of the chip first main surface of the ceramic sintered body. The reason for this is that the ratio of the roughened face of the ceramic chip to the joint interface with the interlayer insulating layer increases when the construction according to this aspect of the present invention is adopted. As a result, the adhesion strength with the interlayer insulating layer may be improved as compared with the former construction.

In one important implementation, the following construction is preferable. The metal layer comprised of a metal, which is softer than the metal comprising a plurality of second terminal electrodes, is formed on the surfaces of plural second terminal electrodes and the convex portion at second main surface side. The reason for this is as follows. Because the plurality of second terminal electrodes comprised of the metallized layer constitute a sintered metal layer which is relatively hard, it is very difficult to directly roughen the surface thereof using an etchant or the like. Thus, by forming a layer comprised of a soft metal so that the surface thereof may be roughened, a predetermined roughness surface can be relatively simply and effectively produced. The surface roughness Ra of the metal layer is preferably about 0.2 μm or more, and more preferably between about 0.2 μm and 1.0 μm. When the surface roughness Ra of the metal layer is different from this, the surface roughness of the metal layer will be similar to that of the chip main surface of the ceramic sintered body. As a result, the adhesion provided may not be less than desired, even though the plural second terminal electrodes occupy an area more than half of the area of the chip main surface.

In this case, the material of the metal layer is preferably chosen according to the kind of material constituting plural second terminal electrodes. When plural second terminal electrodes are comprised of nickel, a copper layer (specifically, a copper plating layer) is, for example, preferably chosen as a metal layer. When such a combination is adopted, the roughened face can be simply and effectively formed, rather than conducting a direct surface roughening of the nickel. Considering the amount which is to be removed in the roughening step, the copper plated layer in this case preferably has the thickness of 5 μm or more, for the sake of safety. In addition, as a method for forming a soft metal layer, the above plating method is suitable, because it is simple and low-cost. However, methods other than plating, such as sputtering, CVD and vacuum deposition can also be adopted.

For the same reason, preferably, the metal layer comprised of the metal, which is softer than the metal constituting a plurality of first terminal electrodes, is formed on the surfaces of plural first terminal electrodes and the convex portion at first main surface side. The surface roughness Ra of the metal layer is preferably 0.2 μm or more.

Although the respective widths of the convex portion at first main surface side and the convex portion at second main surface side are not limited to the following, the widths both are preferably 50 μm or more. One reason for this is that the convex portion will not be able to fully function as a dam which effectively prevents the overflow of the filler when the width of the convex portion is less than about 50 μm.

Although the distance from a chip edge of the ceramic chip to be embedded to the convex portion at the second main surface side is not limited to the following, this distance is preferably 200 μm or less. In this regard, when for the convex portion at second main surface side, the above-mentioned distance exceeds 200, the width of the convex portion at second main surface side must be relatively narrow, thereby resulting in a reduction in the surface area of the convex portion at second main surface side and thereby a reduction in the ratio of the roughened face to the joint interface. On the other hand, when the above-mentioned distance is 200 μm or less, the width of the convex portion at second main surface side can be relatively wide, and the ratio of the roughened face to the joint interface can be increased and can thus contribute to an improvement in the adhesion between the ceramic chip and the interlayer insulating layer. In addition, for the same reason, the distance from the chip edge of the ceramic chip to the convex portion at first main surface side is also preferably 200 μm or less. Since the shorter the above-mentioned distance is the better, the convex portion at second main surface side and/or the convex portion at first main surface side are preferably formed on the chip edge so as to overlap therewith.

The concave portions formed between plurality of second terminal electrodes on the chip second main surface, and between plural second terminal electrodes and the convex portion at second main surface side are preferably filled by the interlayer insulating layer. With this construction, because the contact area of the ceramic chip and the interlayer insulating layer is large, the adhesion between the ceramic chip and the interlayer insulating layer may well improve. It is noted that, for the same reason, the concave portions formed between a plurality of first terminal electrodes in the chip first main surface, and between plural first terminal electrodes and the convex portion at first main surface side, are also preferably filled by the interlayer insulating layer.

In accordance with another embodiment for solving the above-mentioned problem there is provided a ceramic chip to be embedded in a housing opening portion of a substrate core principally comprised of a polymer material, wherein a gap between said housing opening portion and said ceramic chip is filled by a filler, said ceramic chip comprising: a plate-like ceramic sintered body having a chip main surface; an inner conductor formed inside of said ceramic sintered body; a plurality of terminal electrodes comprised of a metallized layer formed on said chip main surface so as to protrude therefrom, and electrically connected to said inner conductor; and a projecting portion formed on said chip main surface so as to protrude therefrom and so as to surround said plurality of terminal electrodes.

Therefore, according to the ceramic chip of this embodiment, by forming the convex portion surrounding a plurality of terminal electrodes on the chip main surface, overflow of the filler onto the chip main surface can be prevented when the gap between the inner surface of the housing opening portion and the ceramic chip is filled with the filler material. Thus, because the problem of the terminal electrodes being covered with the filler is overcome, good electrical connection can be made with the ceramic chip and other layers. When the chip main surfaces are the chip first main surface and the chip second main surface located on the opposite side of the chip first main surface, the convex portion may be formed on both the chip first main surface and the chip second main surface.

In the ceramic chip according to this embodiment, the convex portion surrounding a plurality of terminal electrodes is preferably formed on the chip main surface so as to protrude therefrom. Further, the convex portion may have the same height as that of plural terminal electrodes or may be of a height greater than that of the terminal electrodes. The convex portion preferably comprises a metallized layer disposed in the outer edge portion of the chip main surface. Specifically, when plural terminal electrodes and the convex portion are comprised of the metallized layers, these elements can all be formed in a single step, thereby avoiding an increase in the number of man-hours required. Further, because the convex portion and plural terminal electrodes are formed in a single step, the height of these elements can easily be made to be the same height. The ceramic chip according to this embodiment is preferably a ceramic capacitor having a laminated structure wherein the first internal electrode layer and the second internal electrode layer are alternately laminated by sandwiching the ceramic dielectric layer therebetween. Further, when the stepped portion is formed on the chip main surface, the convex portion may be located in the area including the stepped portion. In preferred embodiments, the width of the convex portion may be 50 μm or more, and the distance from the chip edge to the convex portion may be 200 μm or less. A metal layer comprised of a metal softer than the metal which constitutes the plural terminal electrodes may be formed on the surfaces of plural second terminal electrodes and the convex portion at second main surface side. The surface roughness Ra of this metal layer is preferably 0.2 μm or more.

Further features and advantages of the present invention will be set forth in, or apparent from, the detailed description of preferred embodiments thereof which follows.

DESCRIPTION OF THE PREFERRED EMBODIMENTS

A first embodiment of the invention for producing a wiring board will now be described in detail with reference to the drawings.

Figure 1:
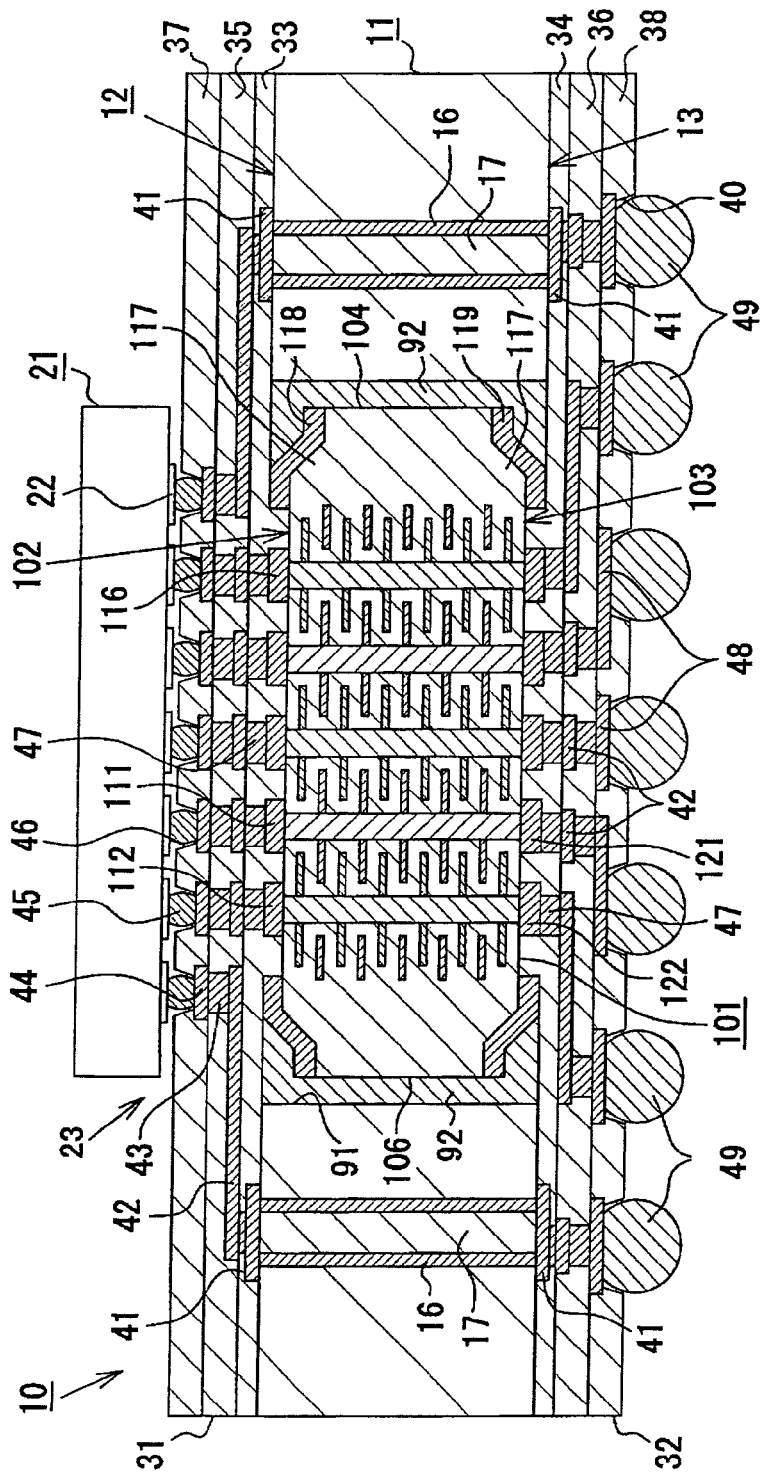
FIG. 1 is a schematic cross-sectional view of a wiring board according to a first embodiment of the present invention.

As shown in FIG. 1, a wiring board 10 according to this embodiment is a wiring board for mounting an IC chip, and comprises: a substrate core 11 comprised of glass epoxy and of a generally rectangular shape; a first built-up layer 31 (a built-up layer) formed on an upper surface 12 (a main core surface) of the substrate core 11; and a second built-up layer 32 formed on an lower surface 13 (a rear core surface) of the substrate core 11. Through-hole conductors 16 are formed at plural locations in the substrate core 11. The through-hole conductors 16 electrically connect the upper surface 12 and the lower surface 13 of the substrate core 11. In addition, the inside of each through-hole conductor 16 is, for example, filled with a plugging body 17, made of a material such as an epoxy resin. Conductor layers 41, comprised of copper, are formed in a pattern on both the upper surface 12, and the lower surface 13, of the substrate core 11 so that each conductor layer 41 may be electrically connected to the through-hole conductor 16.

The first built-up layer 31 formed on the upper surface 12 of the substrate core 11 has a structure wherein resin insulating layers 33, 35 (each layer being hereinafter referred to as an interlayer insulating layer) comprised of epoxy resin, and a conductor layer 42 comprised of copper, are alternately laminated. Terminal pads 44 are formed in an array at plural locations on the surface of the second resin insulating layer 35. Preferably, the surface of the resin insulating layer 35 is almost entirely covered with a solder resist 37. Openings 46 at which the terminal pads 44 are exposed are formed at the predetermined locations in the solder resist 37.

Plural solder bumps 45 are disposed on the respective surfaces of the terminal pads 44. Each solder bump 45 is electrically connected to a planar connection terminal 22 of an IC chip 21 (also referred to as a semiconductor integrated circuit element).

In addition, each terminal pad 44 and each solder bump 45 is located within an area directly above a ceramic capacitor 101 in the first built-up layer 31, and this area serves as a semiconductor element mounting portion generally denoted 23.

The resin insulating layers 33, 35 include via conductors 43, 47, respectively. Most of the individual pairs of via conductors 43, 47 are disposed on a common same axis, and the conductor layers 41, 42 and the terminal pads 44 are electrically connected through the conductors 43, 47.

As shown in FIG. 1, the second built-up layer 32 formed on the lower surface 13 of the substrate core 11 has the almost the same structure as that of the first built-up layer 31. In other words, the second built-up layer 32 has a structure wherein resin insulating layers 34, 36 (hereinafter referred to as an interlayer insulating layer) comprised of epoxy resin, and a conductor layer 42, are alternately laminated. BGA pads 48, which are electrically connected to the conductor layers 42 through the via conductors 43, are formed at plural locations on the lower surface of the second resin insulating layer 36. The lower surface of the resin insulating layer 36 is almost entirely covered with a solder resist 38. Openings 40 at which the BGA pads 48 are exposed are formed in the predetermined locations of the solder resist 38. Plural solder bumps 49 for electrical connection to a motherboard (not illustrated) are disposed on the surfaces of the respective BGA pads 48. The wiring board 10 is mounted on the motherboard (not illustrated) through the solder bumps 49.

Figure 2:
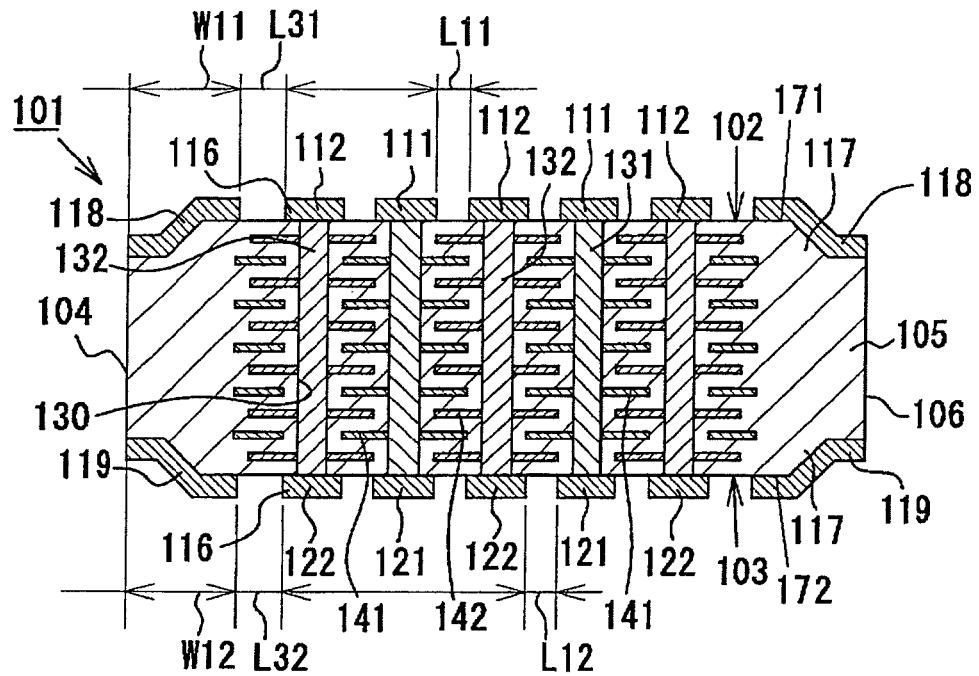
FIG. 2 is a schematic cross-sectional view of a ceramic capacitor.
Figure 3:
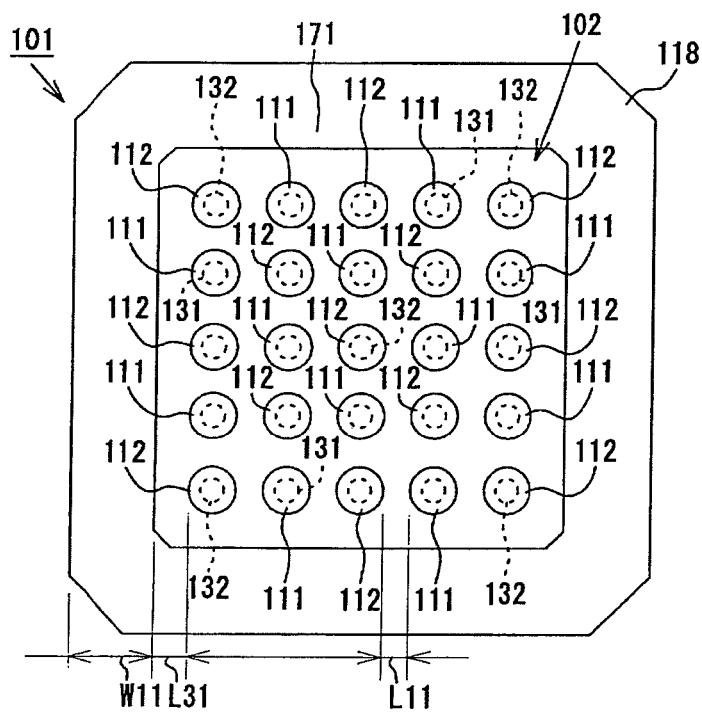
FIG. 3 is a schematic top plan view of the ceramic capacitor of FIG. 2.

The substrate core 11 includes housing opening portion 91, i.e., a portion 91 forming an opening in which capacitor 101 is housed, which is of a rectangular shape as viewed in plan, which opens at the center portion of each of the upper surface 12 and the lower surface 13. In other words, in this embodiment, the housing opening portion 91 is of a through-hole configuration. The ceramic capacitor 101 (also referred to herein as a ceramic chip to be embedded) is shown in FIGS. 2 and 3 and is accommodated in the housing opening portion 91 so as to be embedded therein. In addition, the ceramic capacitor 101 is accommodated in portion 91 so that the upper surface 102 (the chip first main surface) faces the same side, i.e., the same direction, as the upper surface 12 of the substrate core 11.

In a non-limiting example the ceramic capacitor 101 of this embodiment has a rectangle plate-like shape with dimensions of 12.0 mm (length)×12.0 mm (width)×0.8 mm (thickness). In addition, the thickness of the ceramic capacitor 101 is preferably between 0.2 mm and 1.0 mm. When the thickness of the ceramic capacitor is less than 0.2 mm, the ceramic capacitor 101 is unable to securely support the IC chip 21 which is mounted on a semiconductor element mounting portion 23. On the other hand, when the thickness of the ceramic capacitor is larger than 1.0 mm, the wiring board 10 is undesirably thick.

The gap between the inner surface of the housing opening portion 91 and the side face 106 of the ceramic capacitor 101 is filled with a filler 92 comprised of a polymer material (e.g., a thermosetting resin in this embodiment). The filler 92 fixes the ceramic capacitor 101 to the substrate core 11 as well as serves the function of absorbing deformation, by virtue of its own elastic deformation, in both the planar direction and the thickness direction of the ceramic capacitor 101 and the substrate core 11.

In addition, the ceramic capacitor 101 is of a generally square shape as viewed in plan and includes a tapered portion of not less than C 0.60 (or of R 0.60 mm or more in radius) at each four corners thereof. Thus, when the filler 92 deforms due to temperature variations, the stress concentration at the corners of the ceramic capacitor 101 is decreased, thereby preventing cracking of the filler 92.

As shown in FIGS. 1 to 3, the ceramic capacitor 101 of the first embodiment is so-called "a via array type ceramic capacitor." A ceramic sintered body 104 of the ceramic capacitor 101 comprises a plate-like member having upper surface 102 and lower surface 103 (also referred to as a second chip main surface). In addition, the resin insulating layer 33 constituting the first built-up layer 31 is formed on the upper surface 102 of the ceramic sintered body 104, and the resin insulating layer 34 constituting the second built-up layer 32 is formed on the lower surface 103 of the ceramic sintered body 104.

The ceramic sintered body 104 has a structure wherein a first internal electrode layer 141 (inner conductor) and a second internal electrode layer 142 (inner conductor) are alternately laminated with an insulating layer by sandwiching a ceramic dielectric layer 105 therebetween. The ceramic dielectric layer 105 is comprised of a sintered body of barium titanate, a high permittivity ceramic, and functions as a dielectric (insulator) between the first internal electrode layer 141 and the second internal electrode layer 142. The first internal electrode layer 141 and the second internal electrode layer 142 are principally comprised of nickel and are alternately disposed in the ceramic sintered body 104 as described below.

As shown in FIGS. 2 and 3, a plurality of via holes 130 are formed in the ceramic sintered body 104. These via holes 130 penetrate the ceramic sintered body 104 in the thickness direction, i.e., extend through body 104 transversely thereof, and are disposed in a lattice pattern (i.e., in the form of an array) over the whole surface. In each via hole 130, a plurality of via conductors 131, 132 (inner conductors) principally comprised of nickel are formed so as to extend between the upper surface 102 and the lower surface 103 of the ceramic sintered body 104. Each first via conductor 131 extends through each first inner electrode layer 141 so that the first inner electrode layers 141 may be electrically connected to each other. Each second via conductor 132 extends through each second inner electrode layer 142 so that the second inner electrode layers 142 may be electrically connected to each other.

As shown in FIGS. 2 and 3, a plurality of first outer terminal electrodes 111, 112 (first terminal electrodes) are formed on the upper surface 102 of the ceramic sintered body 104 so as to protrude therefrom. The first outer terminal electrodes 111, 112 are disposed in a lattice pattern (i.e., an array form) over the whole upper surface 102.

On the other hand, a plurality of second outer terminal electrodes 121, 122 (second terminal electrodes) are formed on the lower surface 103 of the ceramic sintered body 104 so as to protrude therefrom. The second outer terminal electrodes 121, 122 are disposed in a lattice pattern (an array form) over the whole lower surface 103.

Each first outer terminal electrode 111, 112 disposed at the upper surface 102 is electrically connected to the via conductor 47. On the other hand, each second outer terminal electrode 121, 122 disposed at the lower surface 103 is electrically connected to an electrode (terminal) of a motherboard (not illustrated) through the via conductor 47, the conductor layer 42, the via conductor 43, the BGA pad 48 and the solder bump 49.

Further, a generally center or centrally located portion of the bottom surface of each first outer terminal electrode 111, 112 is directly connected to the end face at the upper surface 102 of the respective via conductor 131, 132. Similarly, the generally center portion of the bottom surface of the second outer terminal electrode 121, 122 is directly connected to the end face at the lower surface 103 of the via conductor 131, 132. Therefore, each outer terminal electrode 111, 121 is electrically connected to the via conductor 131 and each first internal electrode layer 141, and the outer terminal electrode 112, 122 is electrically connected to the via conductor 132 and the second internal electrode layer 142, respectively.

Figure 8:
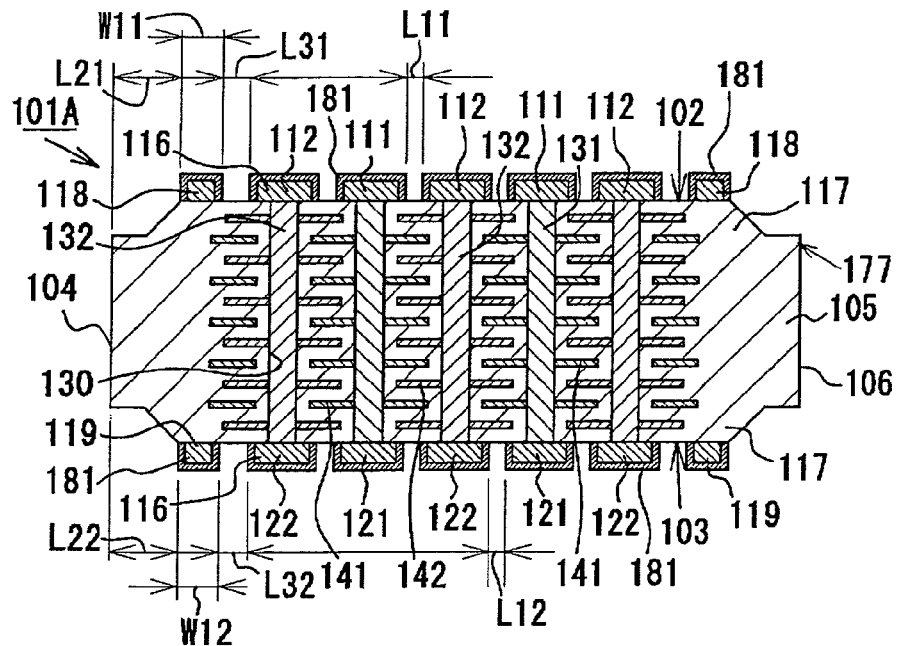
FIG. 8 is a schematic cross-sectional view showing a ceramic capacitor according to a modification of a first embodiment of the invention.

As shown in FIG. 2, the first outer terminal electrode 111, 112 of the first embodiment is comprised of a metallized layer 116 principally made of nickel. Similarly, the second outer terminal electrode 121, 122 is also comprised of the metallized layer 116. Specifically, similar to a ceramic capacitor 101A of the modification as shown in FIG. 8, the surfaces of the metallized layer 116 in the first outer terminal electrode 111, 112 and the second outer terminal electrode 121, 122 may be entirely covered with a copper plating layer 181. The copper plating layer 181 is comprised of a metal softer than the metal which constitutes the metallized layer 116.

In addition, in the copper plating layer as shown in FIG. 8, because the surface of the copper plating layer 181 is roughened, the surface of the first outer terminal electrode 111, 112 is rougher than the upper surface 102 of the ceramic sintered body 104. Similarly, the surface of the second outer terminal electrode 121, 122 is also rougher than the lower surface 103 of the ceramic sintered body 104. It is noted that the surface roughness Ra of the copper plating layers 181 in this modification is about 0.5 μm. Further, the thickness of the metallized layer 116 of the outer terminal electrodes 111, 112, 121, 122 is about 20 μm.

As shown in FIG. 3, the outer terminal electrodes 111, 112, 121, 122 as viewed in a direction perpendicular to the upper surface 102 (also referred to as in the thickness direction) is of a generally circular shape. In this embodiment, the diameter of the outer terminal electrodes 111, 112, 121, 122 is about 500 μm, and the minimum pitch therebetween is about 580 μm.

As shown in FIG. 2, a dam-forming metallized layer 118 (also referred to as a convex or outwardly projecting portion at the first main surface side) is formed on the upper surface 102 of the ceramic sintered body 104 so as to protrude therefrom. The metallized layer 118 is disposed at an outer circumference edge 171 of the upper surface 102 so as to surround a plurality of first outer terminal electrodes 111, 112. Further, the metallized layer 118 is also disposed in an area of body 104 including a stepped portion (notch portion) 117, which is located on the outer circumferential portion of the upper surface 102.

Similarly, a dam-forming metallized layer 119 (a convex or outwardly projecting portion at the second main surface side) is formed on the lower surface 103 of the ceramic sintered body 104 so as to protrude therefrom. The metallized layer 119 is disposed at an outer circumferential edge 172 of the lower surface 103 so as to surround a plurality of second outer terminal electrodes 121, 122. Further, the metallized layer 119 is disposed in an area of body 104 including the stepped portion 117, which is located on the outer circumferential portion of the lower surface 103.

The metallized layers 118, 119 are principally comprised of nickel. In the modification shown in FIG. 8, the surface of metallized layers 118, 119 may be entirely covered with the copper plating layers 181. That is, the metallized layers 118, 119 and the copper plating layer 181 have almost the same layer structure as that of the outer terminal electrodes 111, 112, 121, 122. Further, the copper plating layer 181 is preferably comprised of a metal softer than the metal which constitutes the metallized layers 118, 119. In addition, the metallized layers 118, 119 are not electrically connected to any conductor portions. Furthermore, since the surface of the copper plating layer 181 is roughened, the surface of the metallized layers 118, 119 is rougher than the upper surface 102 and the lower surface 103 of the ceramic sintered body 104.

The metallized layers 118, 119 have the same thickness (height) as that of the metallized layer 116 of the outer terminal electrodes 111, 112, 121, 122, which is about 20 μm. As shown in FIG. 3, the metallized layers 118, 119 (copper plating layer 181) when viewed in a direction perpendicular to the upper surface 102 (i.e., in thickness direction of the body 104) is of a generally rectangular shape with an opening having a generally rectangular shape.

In the ceramic capacitor 101 of the embodiment shown in FIGS. 2 and 3, the widths W11, W12 of the metallized layers 118, 119 are 50 μm or more (specifically, about 500 μm to 1000 μm. The distance from the chip edge of the ceramic capacitor 101 to the metallized layers 118, 119 is about 0 μm. In other words, the outer edges of the metallized layers 118, 119 overlap with the chip edge and thus the metallized layers 118, 119 are of a substantial width. Further, the distance L11 between a plurality of first terminal electrodes 111, 112 and the distance L12 between a plurality of second terminal electrodes 121, 122 are 200 μm or less (more specifically, about 150 μm to 200 μm. Further, the distance L31 between a plurality of first terminal electrodes 111, 112 and the metallized layer 118, and the distance L32 between a plurality of second terminal electrodes 121, 122 and the metallized layer 119 are 200 μm or less (more specifically, about 150 μm to 200 μm). It will, of course, be appreciated that these values are preferred and other widths and distances can be employed.

When a voltage is applied to the first internal electrode layer 141 and the second internal electrode layer 142 through the second outer terminal electrodes 121, 122 from the motherboard side, a positive charge will appear on, for example, the first internal electrode layer 141, and a negative charge will be appear on, for example, the second internal electrode layer 142. As a result, the ceramic capacitor 101 functions as a capacitor. Moreover, in the ceramic capacitor 101, the first via conductors 131 and second via conductors 132 are alternately and adjacently disposed so that the direction of current flow through the first via conductor 131 and the second via conductor 132 may be mutually opposed. As a result, a reduction in the attendant inductance is attained.

Next, a manufacturing method for the wiring board 10 according to the first embodiment will be described.

In a preparatory step, the substrate core 11 and the ceramic capacitor 101 are respectively produced in advance, using a conventional, known method.

Figure 4:
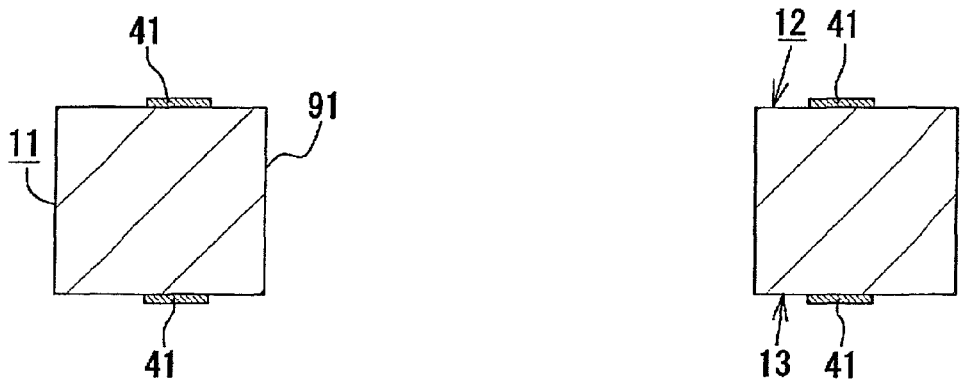
FIG. 4 is a schematic side elevational view used in explanation of a manufacturing method of a wiring board according to one aspect of the invention.

The substrate core 11 is preferably produced as follows. First, a copper-clad laminated board wherein a copper foil is laminated on both surfaces of a substrate having the dimensions of 400 mm (length)×400 mm (width)×0.8 mm (thickness) is prepared. In general, the thickness of the substrate is preferably between 0.2 mm and 1.0 mm. Next, a boring operation is performed in advance of the copper-clad lamination using a drilling machine to form a through-hole (not illustrated) for the abovementioned through-hole conductor 16 in a predetermined location. Further, another boring operation is performed in advance of the copper-clad lamination using a routing machine to form a further through-hole in the predetermined location, which serves as the housing opening portion 91 (refer to FIG. 4). The through-hole serving as the housing opening portion 91 is of a generally square shape in cross-sectional, with a side length of 14.0 mm and a radius R of 0.1-2 mm at the four corners. Then, the through-hole conductor 16 is formed by an electroless copper plating operation and an electrolytic copper plating operation in accordance with the conventional, known method. Further, the copper foil laminated on both surfaces of the copper-clad lamination board is etched to form the pattern of the conductor layer 41 by, for example, a subtractive method. More specifically, after performing the electroless copper plating operation, the electrolytic copper plating is applied thereto, employing the electroless copper plating layer as a common electrode. Subsequently, a dry film is laminated on thus-plated surface and subjected to an exposure and a development operation to thereby form a predetermined pattern. In this process, any unnecessary portions of the electrolytic copper plating layer, electroless copper plating layer and copper foil are removed by etching. Then, the dry film is peeled to complete the substrate core 11.

The ceramic capacitor 101 as shown in FIG. 2 is preferably produced as follows. A ceramic green sheet comprised of ceramics is produced, and then a nickel paste for an internal electrode layer is screen-printed on the green sheet and dried. In this way, a first internal electrode portion serving as the first internal electrode layer 141 and a second internal electrode portion serving as the second internal electrode layer 142 are formed. Next, the green sheet in which the first internal electrode portion is formed and the green sheet in which the second internal electrode portion is formed are alternately laminated, and pressed in the direction of lamination to thereby integrate the green sheets. As a result, a green sheet laminated body is formed.

A plurality of via holes 130 are then formed in the green sheet laminated body using a laser processing machine, and a nickel paste for via conductor is filled in each via hole 130 using a press-fit filling equipment (not shown). Next, a paste is printed on the upper surface of the green sheet laminated body to form the metallized layer 116 of the first outer terminal electrodes 111, 112 so as to cover the upper end face of each conductor portion at the upper side of the green sheet laminated body. The metallized layer 118 is also formed in other areas on the upper surface (in a metallization step). The paste is printed on the lower surface of the green sheet laminated body to form the metallized layer 116 of the second outer terminal electrodes 121, 122 so as to cover the lower end face of each conductor portion at the lower side of the green sheet laminated body. The metallized layer 119 is also formed in other areas on the lower surface (in a metallization step).

Subsequently, the green sheet laminated body is dried so that a surface terminal portion may be solidified to some extent. Next, the green sheet laminated body is degreased and subjected to firing at a predetermined temperature for a predetermined time. As a result, the barium titanate and nickel contained in the paste are simultaneously sintered, thereby forming the ceramic sintered body 104. As a result of these steps, the ceramic capacitor 101 shown in FIGS. 2 and 3 is produced.

Further, the following step is conducted to produce the ceramic capacitor 101A of the modification as shown in FIG. 8. Specifically, the electroless copper metal plating (which is about 10 μm in thickness) is applied to each of the outer terminal electrodes 111, 112, 121, 122 and each metallized layers 118, 119 which are included in the ceramic sintered body 104. As a result, the copper plating layer 181 is formed on each outer terminal electrode 111, 112, 121, 122 and each metallized layer 118, 119, thereby completing the ceramic capacitor 101A as shown in FIG. 8. In addition, since the electroless copper plating is about 10 μm, which is, relatively speaking, slightly thick, a suitable thickness of the copper can be maintained even after a roughening step is performed later. Notably, instead of applying the electroless copper plating, the electrolytic copper plating may be applied.

Figure 5:
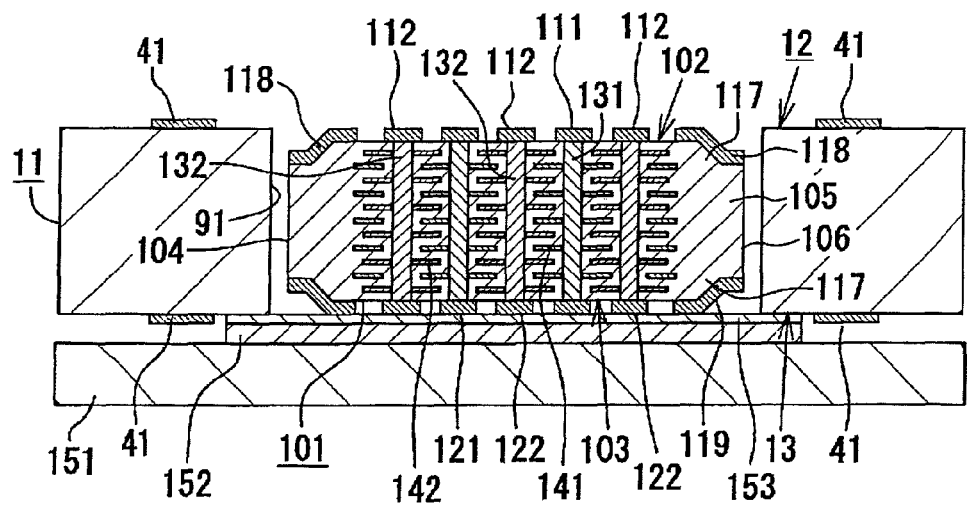
FIG. 5 is a schematic cross-sectional view used in explanation of a manufacturing method of a wiring board.

In a subsequent, taping step, an adhesive tape 152, which can be peeled off, is employed to seal the lower surface side opening of the housing opening portion 91. The adhesive tape 152 is supported by a support board 151. The ceramic capacitor 101 is stuck on, i.e., adhered to, an adhesive face 153 of the adhesive tape 152 so as to be temporarily fixed in place. Further, in a subsequent housing step, the ceramic capacitor 101 is accommodated in the housing opening portion 91 using a mounting device (preferably, a device such as that made by Yamaha Motor Co., Ltd.) (refer to FIG. 5). At this time, the second outer terminal electrodes 121, 122 and the metallized layer 119 are stuck on the adhesive face 153 of the adhesive tape 152.

Figure 6:
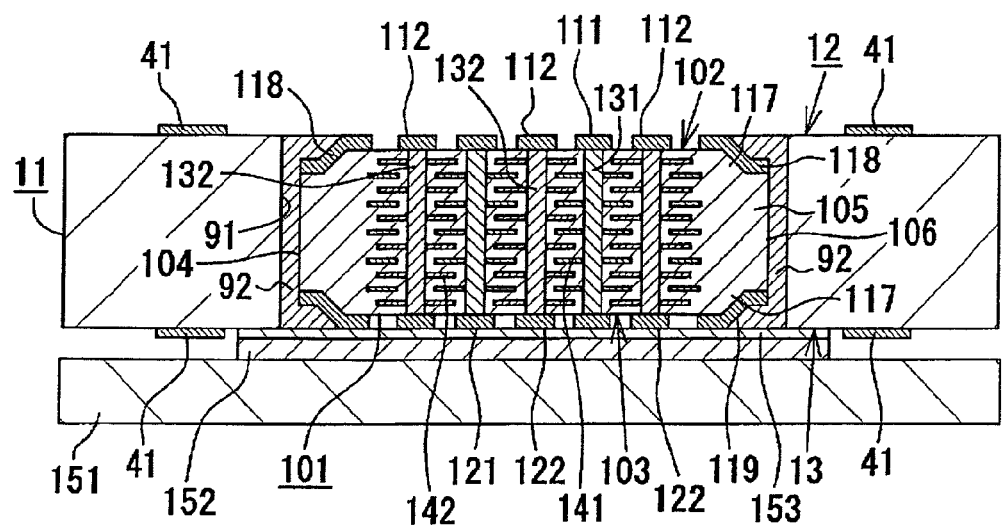
FIG. 6 is a further schematic cross-sectional view used in explanation of a manufacturing method of a wiring board.
Figure 7:
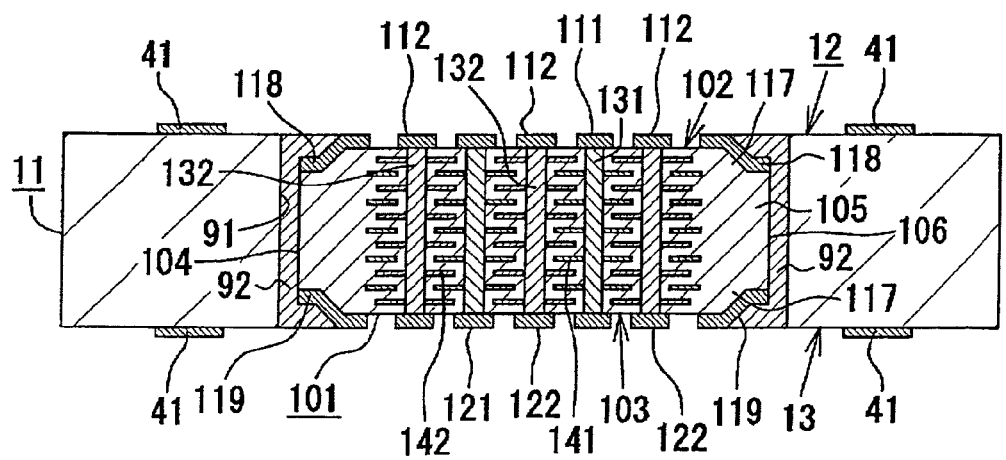
FIG. 7 is yet another schematic cross-sectional view used in explanation of a manufacturing method of a wiring board.

In a fixing step, the gap between the inner surface of the housing opening portion 91 and the side face 106 of the ceramic capacitor 101 is filled with a filler 92 made of thermosetting resin e.g., underfill material, such as that made by Namix Co., Ltd.) using a dispenser device (made by Asymtek) (refer to FIG. 6). Then, the filler 92 is hardened in a heat treatment to fix the ceramic capacitor 101 to the housing opening portion 91. Then, the adhesive tape 152 is peeled at this time (refer to FIG. 7).

The ceramic capacitor 101A according to the modification as shown in FIG. 8 is subjected to a roughening step. In the roughening step, the surfaces of the copper plating layer 181 on outer terminal electrodes 111, 112, 121, 122 and the metallized layers 118, 119 are roughened (e.g., using a CZ treatment). Thus, when the surface of the copper plating layer 181, which is softer than the metallized layers 116, 118, 119, is roughened, a predetermined roughened face can be simply and securely produced. Simultaneously, the surfaces of the conductor layers 41 formed on the upper surface 12 and the lower surface 13 of the substrate core 11 are also roughened. After the roughening step, a rinsing step is conducted. If necessary, a coupling treatment of the upper surface 12 and the lower surface 13 of the substrate core 11 may be performed using a silane coupling agent e.g., such as made by Shin-Etsu Chemical Co., Ltd.).

After completing the rinsing step, a built-up layer formation step is conducted. In the built-up layer formation step, the first built-up layer 31 is formed on the upper surface 12 and the upper surface 102, and the second built-up layer 32 is formed on the lower surface 13 and the lower surface 103, using conventional, known methods. As a result, the wiring board 10 comprised of the substrate core 11, and the built-up layers 31, 32 is completed.

The following effects and advantages can be attained according to the present embodiment.

In the wiring board 10 according to the first embodiment, the metallized layer 118 formed on the upper surface 102 can prevent the overflow of the filler 92 onto the upper surface 102 when the gap between the inner surface of the housing opening portion 91 and the side face 106 of the ceramic capacitor 101 is filled up with the filler 92. Similarly, the metallized layer 119 formed on the lower surface 103 can prevent the overflow of the filler 92 onto the lower surface 103 when the above-mentioned gap is filled with the filler 92. In other words, the metallized layers 118, 119 each serve as a so-called "dam" for damming up, i.e., preventing the spread of, the filler 92. Therefore, since this prevents the outer terminal electrodes 111, 112, 121, 122 from being covered with the filler 92, the electrical connections between the first built-up layer 31, the ceramic capacitor 101 and the second built-up layer 32 can be made secure.

In the ceramic capacitor 101A according to the modification of the present embodiment as shown in FIG. 8, the first outer terminal electrodes 111, 112 as well as the metallized layer 118 are formed on the upper surface 102. Also, the second outer terminal electrode 121, 122 as well as the metallized layer 119 are formed on the lower surface 103. Further, the roughened copper plating layers 181 are formed on these surfaces. Therefore, the ratio of the roughened metal portion to the joint interface with the resin insulating layer 33, which constitutes the first built-up layer 31, is increased, thereby improving the adhesion strength with the resin insulating layer 33. Moreover, the ratio of the roughened metal portion to the joint interface with the resin insulating layer 34, which constitutes the second built-up layer 32, is increased, thereby improving the adhesion strength with the resin insulating layer 34. Moreover, since the unevenness on the upper surface 102 is also eliminated or reduced to some extent, the flatness of the surface of the built-up layer 31, 32 is improved, and thus an IC chip 21 can be more successfully mounted in place. As a result, a "floating" and delamination of the built-up layers 31, 32 due to thermal expansion and the like can be prevented, so that produce reliability is high.

In the first embodiment, because the semiconductor device mounting portion 23 of the first built-up layer 31 is located within an area right above the ceramic capacitor 101, the semiconductor device mounting portion 23 is supported by the ceramic capacitor 101 which as substantial rigidity and a small coefficient of thermal expansion. Therefore, in the semiconductor device mounting portion 23, the first built-up layer 31 is unlikely to deform, and this provides more stable support of the IC chip 21 mounted on the semiconductor device mounting portion 23. Therefore, a large-scale IC chip (e.g., with dimensions 10 mm×10 mm) subject to the influence of thermal stress produced by a high calorific power, or an IC chip of Low-k (lower dielectric constant) can be used as the IC chip 21.

Further, since the wiring board 10 according to this embodiment includes the ceramic capacitor 101 which is capable of removing noise, the current supply to the IC chip 21 is improved. Further, the IC chip 21 is mounted on the semiconductor element mounting portion 23 and located directly above the ceramic capacitor 101. As a result, the length wiring (referred to as the capacitor connection wiring) connecting the IC chip 21 to the ceramic capacitor 101 is shortened. As a result, noise arising between the IC chip 21 and the ceramic capacitor 101 can be significantly reduced, and high reliability can be attained without producing any faults, such as an operational malfunction.

Figure 9:
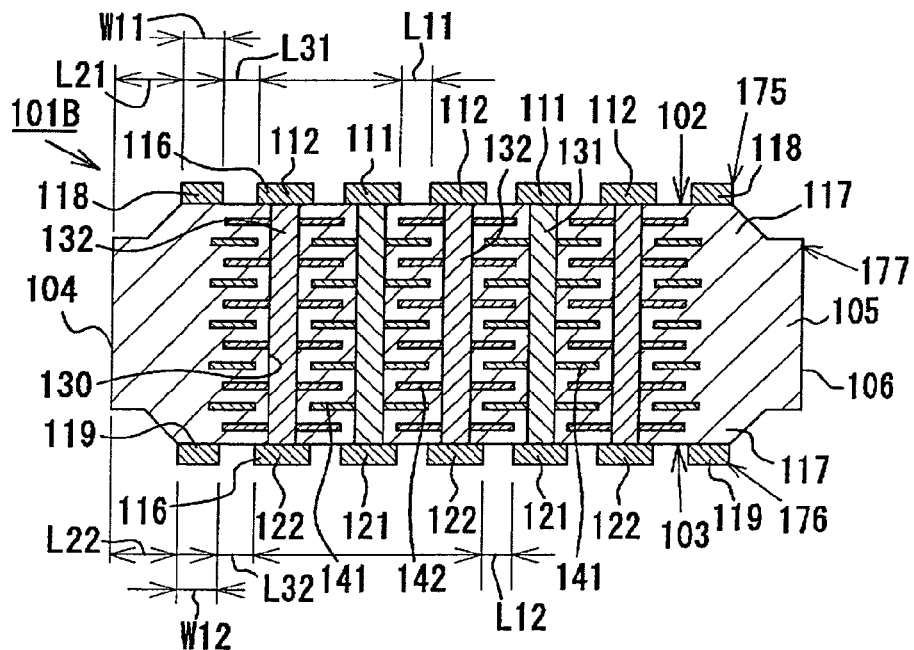
FIG. 9 is a schematic cross-sectional view showing a ceramic capacitor according to a further modification of the first embodiment.
Figure 10:
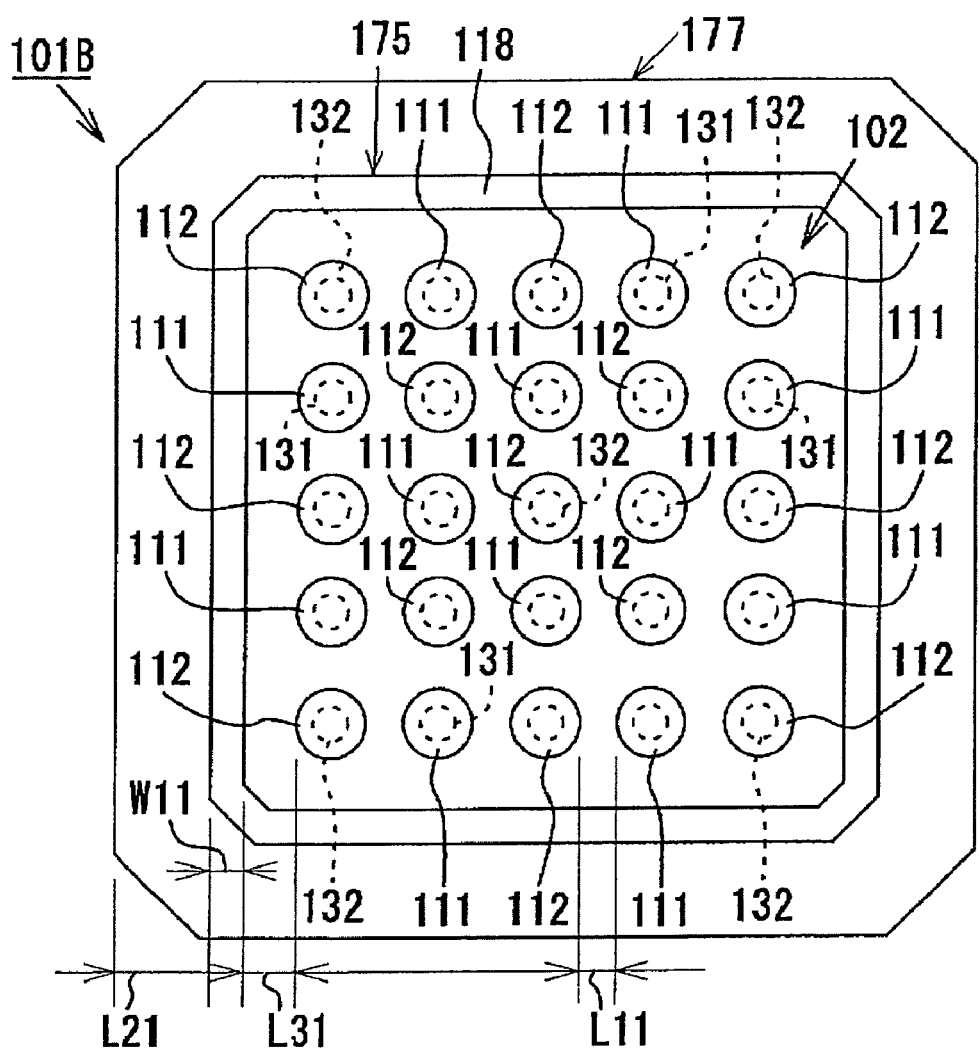
FIG. 10 is a schematic top plan view showing a ceramic capacitor according to a modification of the first embodiment.

Hereinafter, modifications of the above-discussed embodiment will be described. In the above-mentioned modification shown in FIG. 8, the distance L21, L22 from a chip edge of the ceramic capacitor 101A to the metallized layers 118, 119 is 200 μm or less (and, more preferably, about 150 μm to 200 μm). Also, in another modification shown in FIGS. 9 and 10, the distance L21, L22 from a chip edge 177 of a ceramic capacitor 101B to the metallized layer 118 at the first main surface side and to the metallized layer 119 at the second main surface side is 200 μm or less (and, more preferably, about 150 μm to 200 μm). In other words, the outer edges 175, 176 of the metallized layers 118, 119 does not overlap with the chip edge 177, and, therefore, the metallized layers 118, 119 are slightly narrower than those shown in FIGS. 2 and 3. Moreover, the metallized layers 118, 119 include a notch portion (stepped portion) 117 formed in the outer circumference portion on the upper surface 102. The notch portion 117 may either be a C chamfered portion or an R chamfered portion. In addition to what is shown in FIGS. 2 and 3, the ceramic capacitors 101A, 101B having such structure may be built into the substrate core 11.

A further embodiment for carrying out a wiring board according to the present invention will be now described in detail with reference to the drawings.

Figure 11:
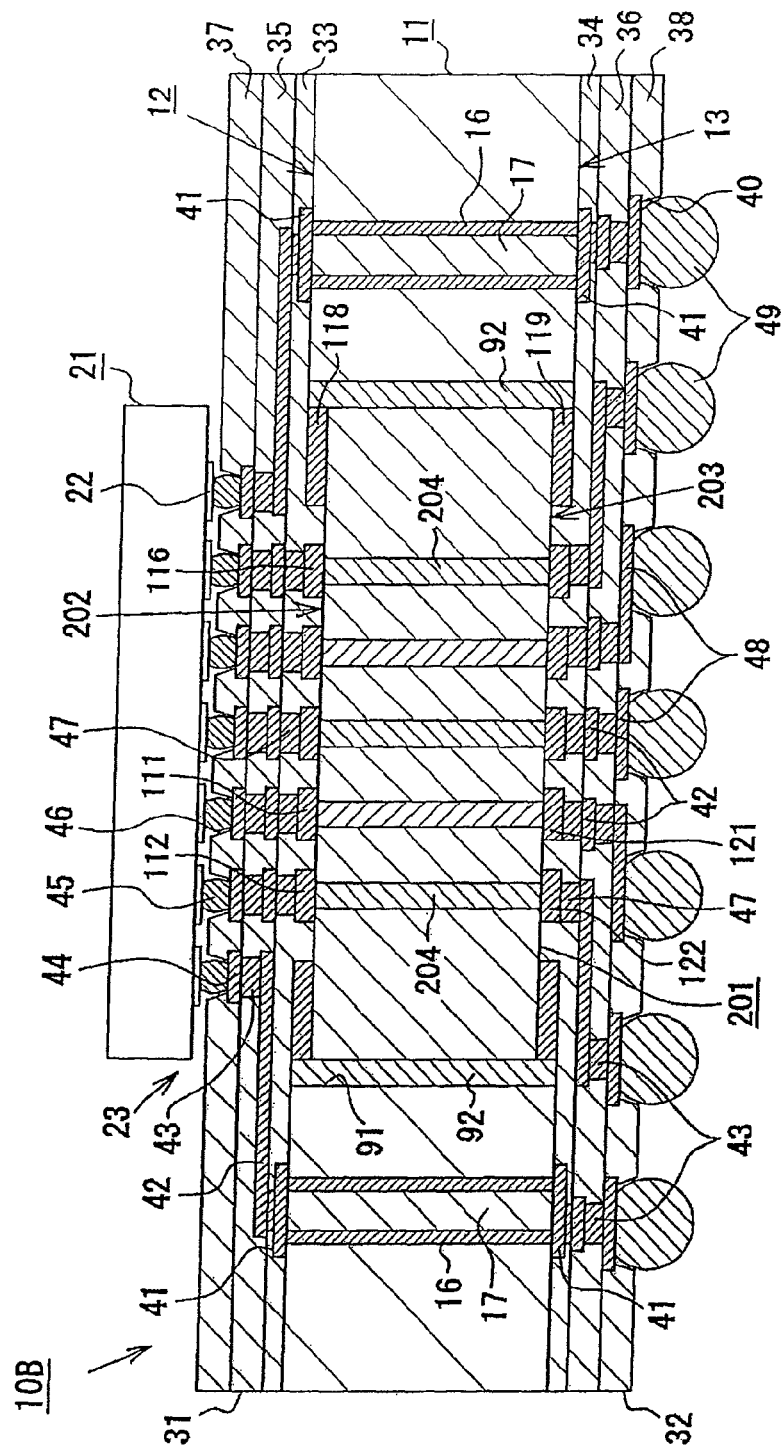
FIG. 11 is a schematic cross-sectional view of a wiring board according to a second embodiment.

In this embodiment, instead of the ceramic capacitor 101 shown in the first embodiment, a ceramic chip 201, as shown in FIG. 11, not including a capacitor function is formed in, i.e., built into, the wiring board 10B. A plurality of via conductors 204 (inner conductors) are formed in an array pattern, and penetrate the upper surface 202 (chip first main surface) and the lower surface 203 (chip second main surface) of the ceramic chip 201. The metallized layer 116 of the first outer terminal electrodes 111, 112 is disposed on the upper surface 202. Further, the metallized layer 116 of the second outer terminal electrodes 121, 122 is disposed on the lower surface 203. In addition, the metallized layers 118, 119 are provided on the upper surface 202 and the lower surface 203, respectively. Further, the metallized layers 116, 118, 119 of this embodiment are principally comprised of molybdenum. A nickel plating layer (not illustrated) and a copper plating layer (not illustrated) may be laminated, in this order, on the surface of the metallized layers 116, 118, 119. Therefore, in this embodiment, the wiring board 10B provides excellent adhesion between interlayer insulating layers 33, 34 constituting the built-up layers 31, 32 and the ceramic chip 201.

Next, yet another embodiment for carrying out a wiring board according to the present invention will be described in detail with reference to the drawings.

Figure 12:
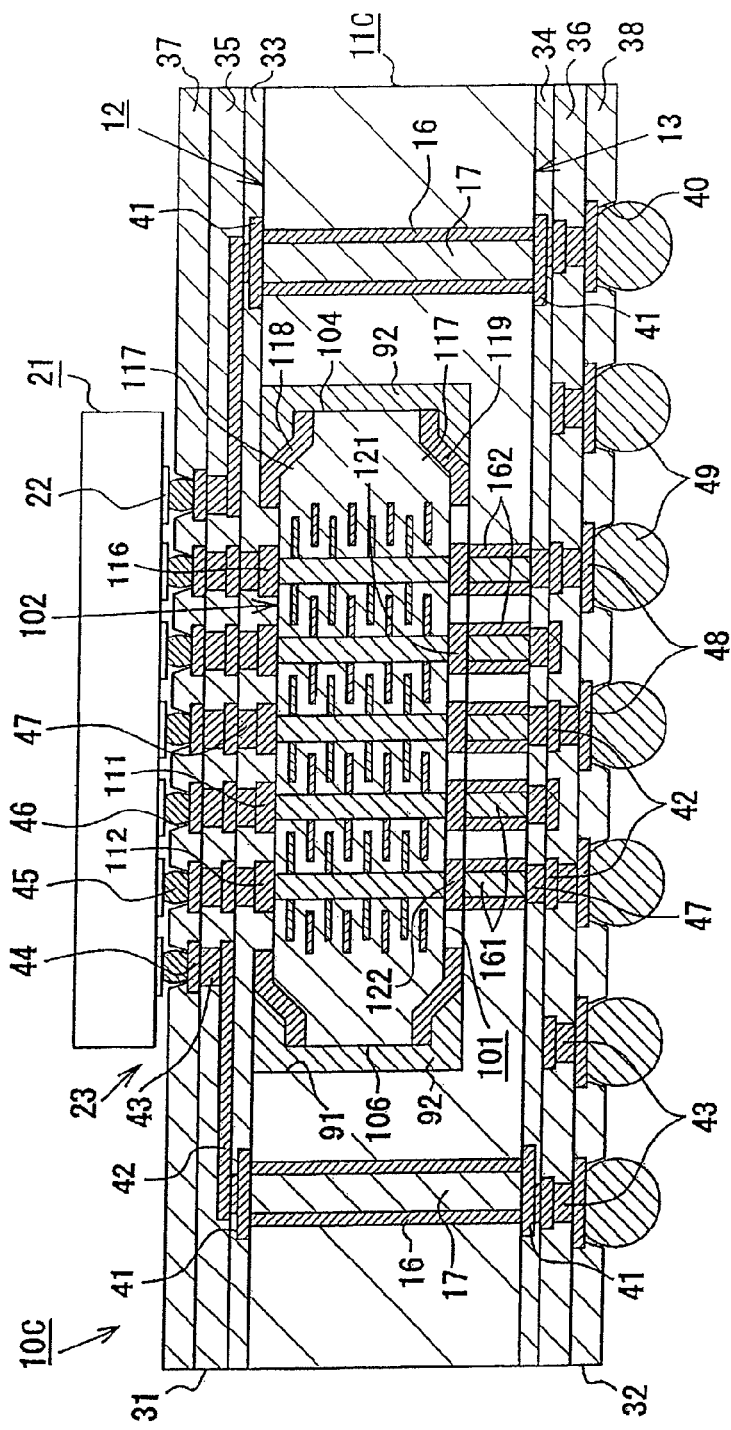
FIG. 12 is a schematic cross-sectional view of a wiring board according to a third embodiment.

As shown in FIG. 12, in a wiring board 10C according to this embodiment, the housing opening portion 91 of the substrate core 11C does not extend through core 11C but rather is a concave portion having a bottom (also referred to as a non-through-hole portion), which is open only at the upper surface 12 of the substrate core 11C. Thus, the entire resin insulating layer 34 of the second built-up layer 32 is in contact with the lower surface 13 of the substrate core 11C. Further, the ceramic capacitor 101, which as the same construction as the first embodiment, is formed in, i.e., is disposed in, the housing opening portion 91. In addition, the resin insulating layer 34 and the ceramic capacitor 101 are electrically connected to each other through a plurality of via conductors 162 penetrating through the bottom surface of the housing opening portion 91 to the lower surface 13 of the substrate core 11C. The inside of the via conductor 162 is filled with a conductive paste 161.

In addition to the modifications discussed above, each embodiment of the present invention may be individually modified as follows.

According to each embodiment described above, in the roughening step, simultaneously with the roughening of the surface of each copper plating layers 181, the surface of each conductor layer 41 is roughened. However, each copper plating layer 181 may be roughened separately from the roughening of each conductor layer 41.

According to each embodiment described above, the metallized layers 118, 119 (copper plating layers 181) are of a generally rectangular shape when viewed in plan, i.e., in a direction perpendicular to the upper surface 102, and have an opening with a generally rectangular shape. However, the shapes of metallized layers 118, 119 (copper plating layers 181) may be of other forms and shapes.

According to the two above-described embodiments, the surface conductor comprised of the metallized layers 118, 119 and the copper plating layer 181 have the almost same layer structure as that of the outer terminal electrodes 111, 112, 121, 122; however, a different layer structure may be employed. Further, the thickness of the metallized layers 118, 119 may be the same thickness as that of the metallized layer 116, or thicker than that of the metallized layer 116.

Instead of employing filler 92 as in each embodiment described above, a portion of resin insulating layer 33 may be employed as filler. This can be done by employing a flowable resin film and conducting a pressurized lamination operation when the resin insulating layer 33 constituting the first built-up layer 31 is formed. In this way, the gap between the inner surface of the housing opening portion 91 and the side face 106 of the ceramic capacitor 101 is not necessarily filled by the filler 92 in advance, but rather a portion of the resin film extends into the gap so as to function as filler. Moreover, although the gap is filled by the filler 92 using a dispenser device in embodiments described above, the invention is not limited to this technique. The filler 92 may be provided by, for example, a printing apparatus.

Figure 13:
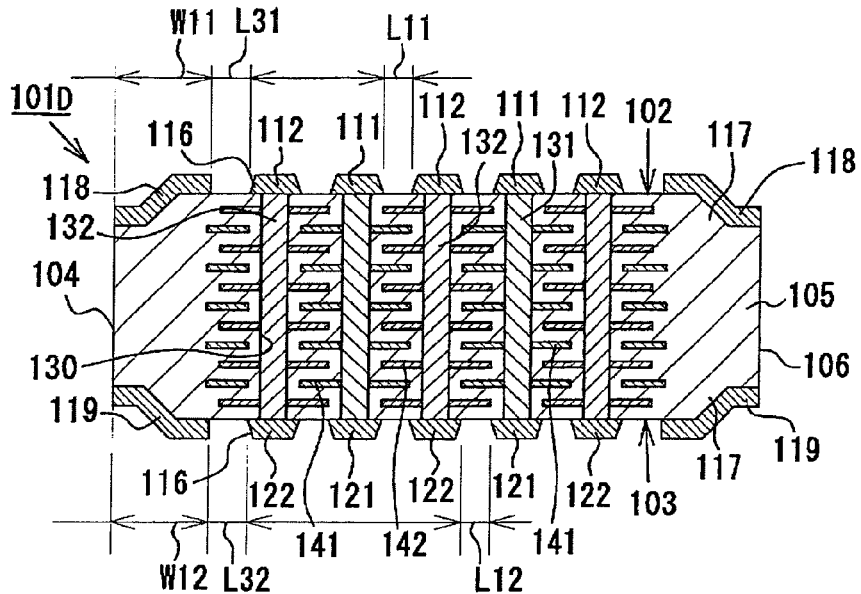
FIG. 13 is a schematic cross-sectional view of a ceramic capacitor according to another embodiment.
Figure 14:
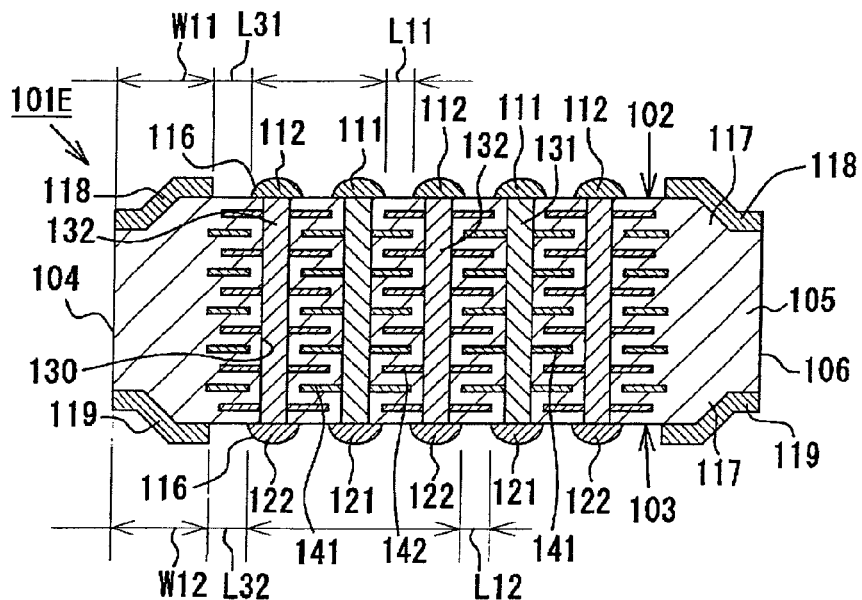
FIG. 14 is a schematic cross-sectional view of a ceramic capacitor according to another embodiment.

As shown in FIG. 2, the outer terminal electrodes 111, 112, 121, 122 in each embodiment described above is of a rectangular shape in the cross section, wherein the upper and lower sides thereof are of the same length, but different shapes can be employed. For example, in the ceramic capacitor 101D of another embodiment shown in FIG. 13, the outer terminal electrodes 111, 112, 121, 122 have a tapered form or shape in cross section wherein the upper side thereof is shorter than the lower side. Further, in a ceramic capacitor 101E of another embodiment shown in FIG. 14, the surface of the outer terminal electrodes 111, 112, 121, 122 has a spherical surface. When the outer terminal electrode has such a shape as shown in FIGS. 13 and 14, the resin of the resin insulating layers 33, 34 easily flows into the concave portion, thereby improving adhesion. However, when adopting these constructions, the metallized layers 118, 119 preferably have a flat portion on the surface thereof. The reason for this is that a metallized layer having a flat portion on the surface thereof tends to more effectively function as a "dam" as compared to the case where the metallized layer has a spherical surface.

Figure 15:
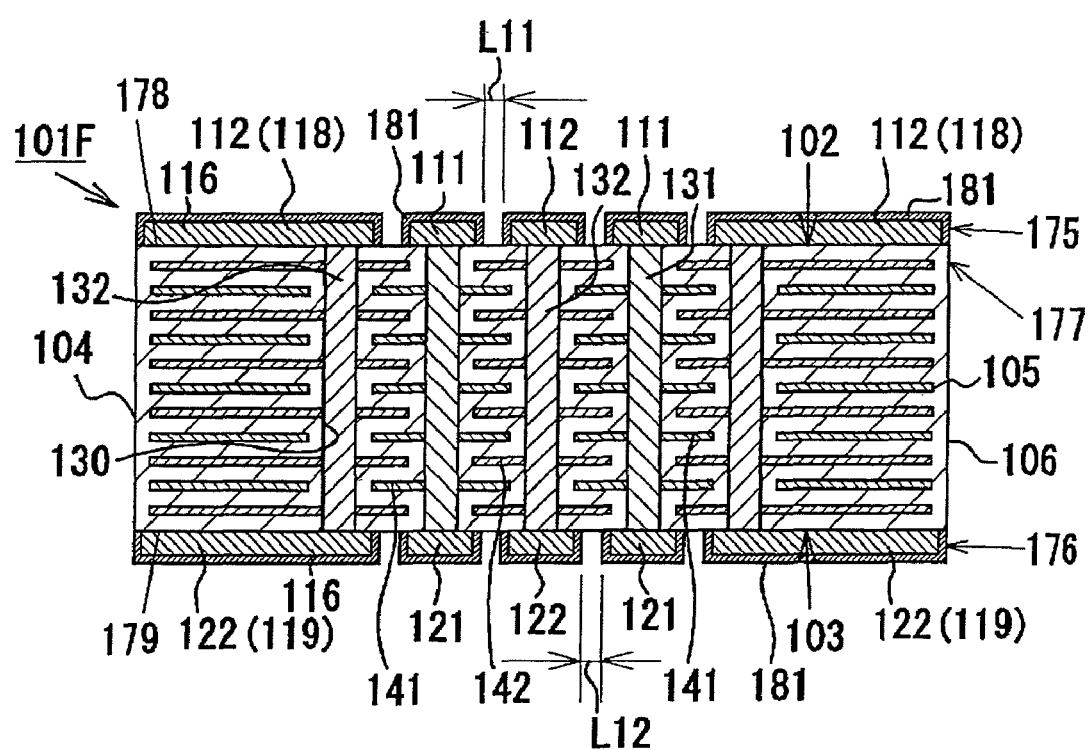
FIG. 15 is a schematic cross-sectional view of a ceramic capacitor according to another embodiment.
Figure 16:
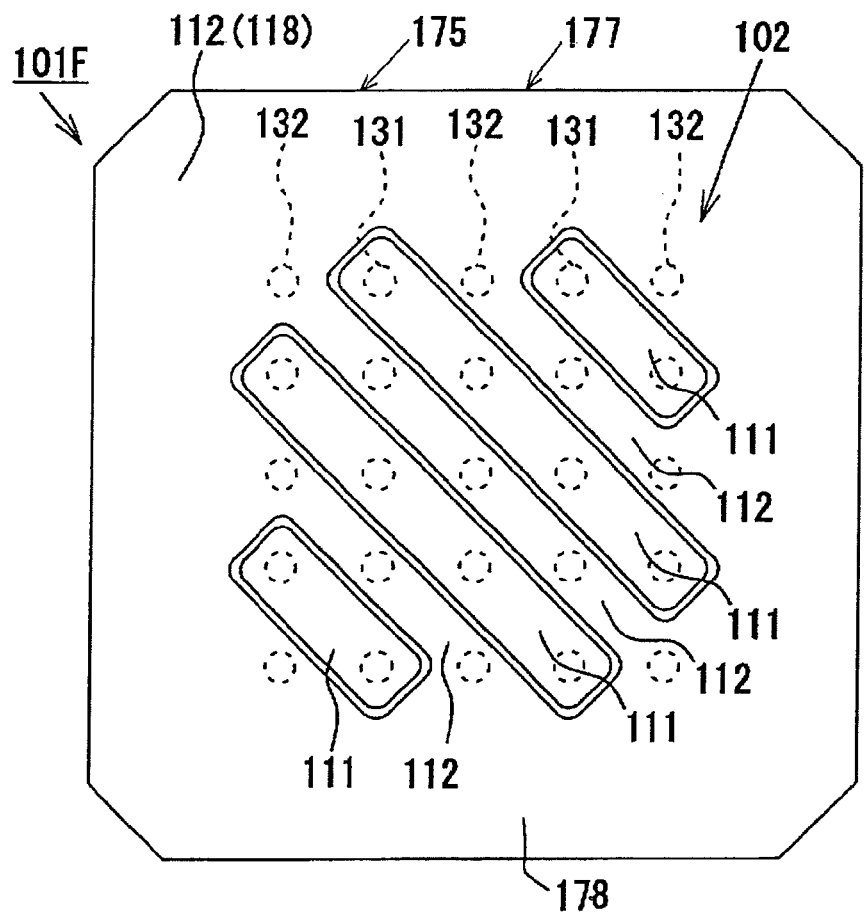
FIG. 16 is a schematic cross-sectional view of a ceramic capacitor according to another embodiment.

A ceramic capacitor 101F of another embodiment shown in FIGS. 15 and 16 does not have a stepped portion, but does, however, have a power supply first outer terminal electrode 111, a ground first outer terminal electrode 112, a power supply second outer terminal electrode 121 and a ground second outer terminal electrode 122. The outer terminal electrodes 111, 121 of this embodiment is a linear electrode formed so that a plurality of via conductors 131 may be connected to each other. On the other hand, the outer terminal electrodes 112, 122 are each a plane electrode formed so that a plurality of via conductors 132 may be connected to each other. In addition, the ground first outer terminal electrodes 112 and the ground second outer terminal electrodes 122 are coupled, respectively, and an outer edge 175, 176 thereof reaches to a chip edge 177. In other words, the ground first outer terminal electrode 112 connected to the metallized layer 118 at the first main surface side is disposed so as to surround a plurality of power supply first outer terminal electrodes 111 in the outer circumference edge portion 178 of the upper surface 102. Therefore, the ground first outer terminal electrode 112 can be regarded as a first plane ground electrode which functions as the first metallized layer 118.

Further, the ground second outer terminal electrode 122 connected to the metallized layer 119 at the second main surface side is disposed so as to surround a plurality of power supply second outer terminal electrodes 121 in the outer circumference edge portion 179 of the lower surface 103. Therefore, the ground second outer terminal electrode 122 can be regarded as a second plane ground electrode which functions as the second metallized layer 119.

Further, since the side face 106, including the outer edges 175, 176 is flat, penetration of the filler 92 to the upper surface 102 of the capacitor can be prevented. An advantage of this construction is that cracks are unlikely to occur in the filler 92 near the chip edge 177 when the filler 92 hardens. Thus, product reliability can be improved.

Figure 17:
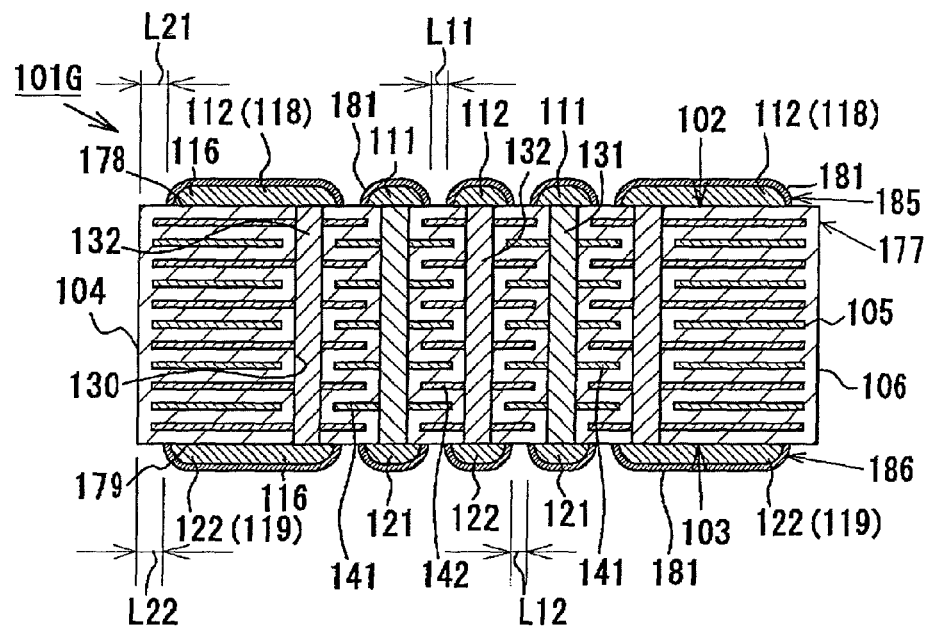
FIG. 17 is a schematic cross-sectional view of a ceramic capacitor according to another embodiment.
Figure 18:
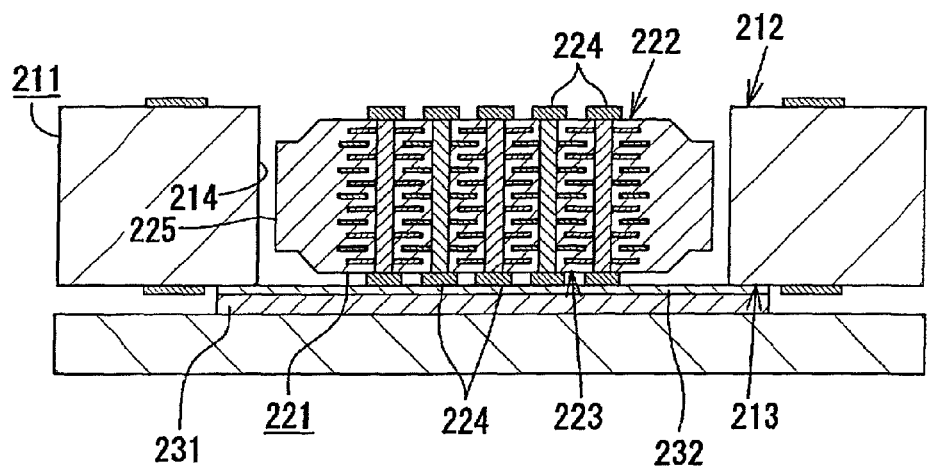
FIGS. 18 and 19 were described above.
Figure 19:
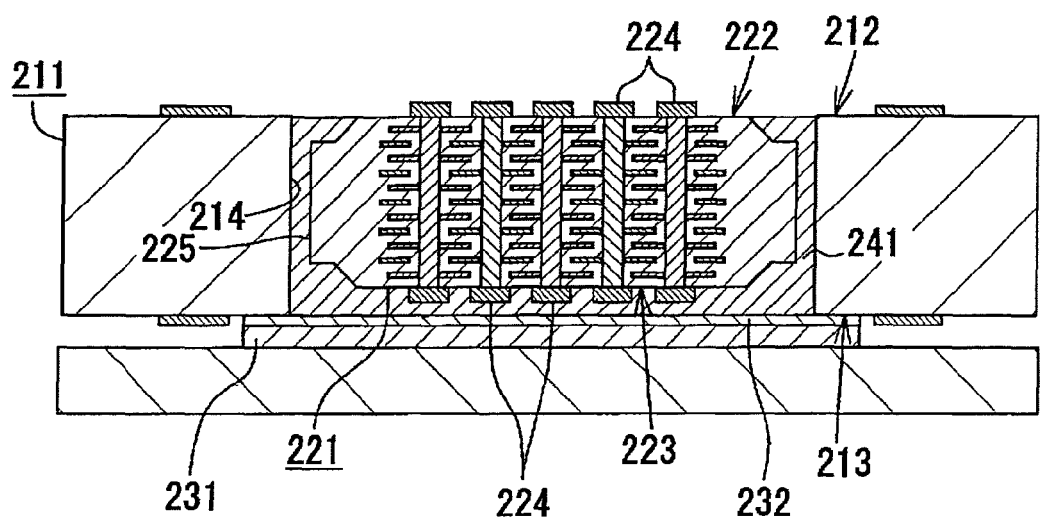

A ceramic capacitor 101G of another embodiment shown in FIG. 17 also has a similar construction to that of FIG. 16. However, the difference between the embodiments is that the respective outer terminal electrodes 112, 122 serving as the metallized layers 118, 119 do not reach to the chip edge. Moreover, the surface of the outer terminal electrodes 111, 112, 121, 122 is of a spherical shape or form. In this construction, the ground first outer terminal electrodes 112 and the ground second outer terminal electrodes 122 are coupled, respectively, and an outer edge 185, 186 has a R face. Therefore, this construction also has the advantage that cracking is unlikely to occur in the filler 92 near the chip edge 177 when the filler 92 hardens. Thus, reliability can be improved.

Although the reasons why the above-mentioned cracking can be prevented is not known with certainty, it is presumed that the angle formed by the upper surface 102 (or lower surface 103) of the chip and the electrode side face is larger than 90 degrees, and thus it is unlikely to be the origin of crack generation.

In the above-mentioned ceramic capacitors 101F and 101G, a second plane power electrode may be formed instead of the second plane ground electrode. In other words, at the upper surface 102 side, the ground first outer terminal electrode 112 is connected to the metallized layer 118 at the first main surface side and disposed so as to surround a plurality of power supply first outer terminal electrodes 111 in the outer circumference edge portion 178 of the upper surface 102. On the other hand, at the lower surface 103 side, the power supply second outer terminal electrode is connected to the metallized layer 119 at the second main surface side and disposed so as to surround the ground second outer terminal electrodes in the outer circumference edge portion 179 of the lower surface 103. By using the terminal electrodes formed on the upper surface 102 and the lower surface 103 as different type of plane electrodes, the electrolytic plating may be effectively performed.

Each embodiment described above exemplifies a construction wherein the ceramic chip is accommodated in the housing opening portion 91 of the substrate core 11. However, a construction wherein a material other than a chip comprised mainly of ceramics, such as a chip component having a plurality of terminal electrodes, is accommodated, may also be adopted.

Although the invention has been described above in relation to preferred embodiments thereof, it will be understood by those skilled in the art that variations and modifications can be effected in these preferred embodiments without departing from the scope and spirit of the invention.

What is claimed:

1. A ceramic chip to be embedded in a housing opening portion of a substrate core principally comprised of a polymer material, wherein a gap between said housing opening portion and said ceramic chip is filled by a filler, said ceramic chip comprising:
    a plate-like ceramic sintered body having a chip main surface;
    an inner conductor formed inside of said ceramic sintered body;
    a plurality of terminal electrodes comprised of a metallized layer formed on said chip main surface so as to protrude therefrom, and electrically connected to said inner conductor; and
    a projecting portion, unconnected to an electrode, formed on said chip main surface outwardly of said plurality of terminal electrodes so as to protrude from said chip main surface and so as to surround said plurality of terminal electrodes, for preventing spreading of said filler.

2. A ceramic chip according to claim 1,
    wherein said projecting portion is of a height at least equal to that of said terminal electrodes.

3. A ceramic chip according to claim 1,
    wherein said projecting portion comprises a metallized layer disposed on an outer edge portion of said chip main surface.

4. A ceramic chip according to claim 1,
    wherein said ceramic chip comprises a ceramic capacitor having a laminated structure wherein a first internal electrode layer and a second internal electrode layer sandwich a ceramic dielectric layer therebetween.

5. A ceramic chip according to claim 1, further comprising a stepped portion formed at said chip main surface, and
    wherein said projecting portion is disposed in an area including said stepped portion.

6. A ceramic chip according to claim 1,
    wherein said projecting portion has a width of at least 50 μm.

7. A ceramic chip according to claim 1,
    wherein said plurality of terminal electrodes are formed of a metal and a metal layer comprised of a metal softer than the metal of said plurality of second terminal electrodes is formed on surfaces of said plurality of second terminal electrodes and said projecting portion at the second main surface side, and
    wherein the surface roughness Ra of said metal layer is at least 0.2 μm.

8. A ceramic chip according to claim 1,
    wherein a chip edge is spaced from said projecting portion by a distance of no greater than 200 μm.

9. The ceramic chip of claim 1, wherein said plurality of terminal electrodes have a tapered shape in cross section tapering from the chip main surface inwardly toward an outer surface thereof.

10. The ceramic chip of claim 1, wherein said plurality of terminal electrodes have a semi-spherical shape in cross section.

11. A ceramic chip to be embedded in a housing opening portion of a substrate core principally comprised of a polymer material, wherein a gap between said housing opening portion and the ceramic chip is filled by a filler, the ceramic chip comprising:
    a plate-like ceramic sintered body having a chip main surface;
    an inner conductor located inside of said ceramic sintered body;
    a plurality of terminal electrodes comprised of a metallized layer formed on said chip main surface and electrically connected to said inner conductor, said plurality of terminal electrodes comprising ground terminal electrodes and power supply terminal electrodes, and a metallized layer (i) disposed on an outer circumferential edge of said chip main surface, (ii) formed directly on the chip main surface, (iii) comprised of nickel (Ni) as a main component, and (iv) plated with a copper (Cu) plating layer on a surface thereof, wherein a surface of the copper plating layer is roughened, and said plurality of terminal electrodes comprising one of (i) an arrangement wherein said ground terminal electrodes are connected to said metallized layer and serve as a plane ground electrode which surrounds said power supply terminal electrodes, and (ii) an arrangement wherein said power supply terminal electrodes are connected to said metallized layer and serve as a plane power supply electrode which surrounds said ground terminal electrodes.

12. A ceramic chip to be embedded according to claim 11, wherein said metallized layer extends to a chip edge.

13. A ceramic chip to be embedded according to claim 11, wherein a notch portion is formed on said chip main surface, and said metallized layer is formed so as to at least extend to the notch portion.

14. A ceramic chip to be embedded according to claim 13, wherein said metallized layer is located in an area of said sintered body including said notch portion.

15. A ceramic chip to be embedded according to claim 11, wherein an outer edge of the metallized layer has a radiussed face.

16. A ceramic chip to be embedded according to claim 11, wherein the ground terminal electrodes are a linear electrode formed so that a plurality of first via conductors are connected to each other; and wherein the power supply terminal electrodes are a plane electrode formed so that a plurality of second via conductors are connected to each other.

17. A wiring board comprising:

a substrate core having a core main surface, a core rear surface and a housing opening portion which opens at said core main surface but does not extend through the substrate core;

a ceramic chip including a ceramic sintered body having a chip first main surface and a chip second main surface, an inner conductor located inside of said ceramic sintered body, a plurality of first terminal electrodes comprised of a metallized layer, electrically connected to said inner conductor, formed on said chip first main surface so as to protrude therefrom, and a plurality of second terminal electrodes comprised of a metallized layer, electrically connected to said inner conductor, and formed on said chip second main surface so as to protrude therefrom, the ceramic chip being accommodated in said housing opening portion such that said core main surface and said chip first main surface face in a common direction;

a filler disposed in a gap between an inner surface of said housing opening portion and a side face of said ceramic chip so as to fix said ceramic chip in place;

a built-up layer comprising at least one interlayer insulating layer and at least one conductor layer alternately laminated on both said core main surface and said chip first main surface; and a projecting portion, unconnected to an electrode, disposed on a second main surface side of the chip outwardly of said plurality of second terminal electrodes so as to surround said plurality of second terminal electrodes, and formed on said chip second main surface so as to protrude therefrom, for preventing spreading of said filler.

* * * * *